(12) United States Patent
Yamazaki et al.

(10) Patent No.: US 8,735,889 B2
(45) Date of Patent: May 27, 2014

(54) SEMICONDUCTOR DEVICE AND MANUFACTURING METHOD THEREOF

(75) Inventors: Shunpei Yamazaki, Tokyo (JP); Hideomi Suzawa, Kanagawa (JP); Yoshihiro Kusuyama, Kanagawa (JP); Koji Ono, Kanagawa (JP); Jun Koyama, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 128 days.

(21) Appl. No.: 13/286,280

(22) Filed: Nov. 1, 2011

(65) Prior Publication Data

US 2012/0043580 A1    Feb. 23, 2012

Related U.S. Application Data

(60) Continuation of application No. 12/124,385, filed on May 21, 2008, now Pat. No. 8,053,339, which is a continuation of application No. 10/978,512, filed on Nov. 2, 2004, now Pat. No. 7,405,115, which is a continuation of application No. 10/718,584, filed on Nov. 24, 2003, now Pat. No. 6,984,550, which is a division of application No. 10/078,489, filed on Feb. 21, 2002, now Pat. No. 6,657,260.

(30) Foreign Application Priority Data

Feb. 28, 2001 (JP) .................. 2001-056063
Sep. 28, 2001 (JP) .................. 2001-302687

(51) Int. Cl.
*H01L 29/04* (2006.01)

(52) U.S. Cl.
USPC ......... 257/59; 438/166; 257/72; 257/E29.151

(58) Field of Classification Search
CPC ....................................... H01L 27/32
USPC ............. 257/59, 72, E29.151, E29.137; 438/486, 487, 308, 166; 349/43, 144
See application file for complete search history.

(56) References Cited

U.S. PATENT DOCUMENTS 3,108,914 A   10/1963   Hoerni
3,791,883 A   2/1974    Takei et al.
(Continued)

FOREIGN PATENT DOCUMENTS

CN   1276622 A    12/2000
EP   0082012 A2   6/1983
(Continued)

OTHER PUBLICATIONS

B.C. Ahn et al.; "Batch-Processing of High-Performance Amorphous-Silicon/Silicon-Nitride Thin-Film Transistors" IEEE Display Research Conference, pp. 85-88 (1991).

(Continued)

*Primary Examiner* — David Vu
(74) *Attorney, Agent, or Firm* — Fish & Richardson P.C.

(57) ABSTRACT

There are provided a structure of a semiconductor device in which low power consumption is realized even in a case where a size of a display region is increased to be a large size screen and a manufacturing method thereof. A gate electrode in a pixel portion is formed as a three layered structure of a material film containing mainly W, a material film containing mainly Al, and a material film containing mainly Ti to reduce a wiring resistance. A wiring is etched using an IPC etching apparatus. The gate electrode has a taper shape and the width of a region which becomes the taper shape is set to be 1 μm or more.

20 Claims, 18 Drawing Sheets

(56) References Cited

U.S. PATENT DOCUMENTS

| | | |
|---|---|---|
| 4,309,224 A | 1/1982 | Shibata |
| 4,330,363 A | 5/1982 | Biegesen et al. |
| 4,502,204 A | 3/1985 | Togashi et al. |
| 4,727,044 A | 2/1988 | Yamazaki |
| 4,851,363 A | 7/1989 | Troxell et al. |
| 4,915,772 A | 4/1990 | Fehlner et al. |
| 4,985,750 A | 1/1991 | Hoshino |
| 5,075,259 A | 12/1991 | Moran |
| 5,108,843 A | 4/1992 | Ohtaka et al. |
| 5,147,826 A | 9/1992 | Liu et al. |
| 5,219,786 A | 6/1993 | Noguchi |
| 5,244,836 A | 9/1993 | Lim |
| 5,248,630 A | 9/1993 | Serikawa et al. |
| 5,273,920 A | 12/1993 | Kwasnick et al. |
| 5,278,093 A | 1/1994 | Yonehara |
| 5,289,030 A | 2/1994 | Yamazaki et al. |
| 5,311,041 A | 5/1994 | Tominaga et al. |
| 5,352,291 A | 10/1994 | Zhang et al. |
| 5,387,530 A | 2/1995 | Doyle et al. |
| 5,396,084 A | 3/1995 | Matsumoto |
| 5,403,772 A | 4/1995 | Zhang et al. |
| 5,426,064 A | 6/1995 | Zhang et al. |
| 5,459,087 A | 10/1995 | Mochizuki |
| 5,481,121 A | 1/1996 | Zhang et al. |
| 5,529,937 A | 6/1996 | Zhang et al. |
| 5,605,846 A | 2/1997 | Ohtani et al. |
| 5,639,698 A | 6/1997 | Yamazaki et al. |
| 5,684,318 A | 11/1997 | Ayres et al. |
| 5,694,061 A | 12/1997 | Morosawa et al. |
| 5,710,050 A | 1/1998 | Makita et al. |
| 5,731,216 A | 3/1998 | Holmberg et al. |
| 5,773,327 A | 6/1998 | Yamazaki et al. |
| 5,821,138 A | 10/1998 | Yamazaki et al. |
| 5,838,037 A | 11/1998 | Masutani |
| 5,843,225 A | 12/1998 | Takayama et al. |
| 5,889,291 A | 3/1999 | Koyama et al. |
| 5,946,562 A | 8/1999 | Kuo |
| 5,990,998 A | 11/1999 | Park et al. |
| 6,008,065 A | 12/1999 | Lee |
| 6,031,290 A | 2/2000 | Miyazaki et al. |
| 6,130,443 A | 10/2000 | Hong et al. |
| 6,160,270 A | 12/2000 | Holmberg et al. |
| 6,165,824 A | 12/2000 | Takano et al. |
| 6,168,981 B1 | 1/2001 | Battaglia et al. |
| 6,287,988 B1 | 9/2001 | Nagamine et al. |
| 6,288,414 B1 | 9/2001 | Ahn |
| 6,346,437 B1 | 2/2002 | Maekawa et al. |
| 6,365,917 B1 | 4/2002 | Yamazaki |
| 6,376,333 B1 | 4/2002 | Yamazaki et al. |
| 6,392,722 B1 | 5/2002 | Sekime |
| 6,399,454 B1 | 6/2002 | Yamazaki |
| 6,404,465 B1 | 6/2002 | Nakayama |
| 6,433,841 B1 | 8/2002 | Murade |
| 6,436,745 B1 | 8/2002 | Gotou et al. |
| 6,441,399 B1 | 8/2002 | Koyama et al. |
| 6,448,578 B1 | 9/2002 | Shimada et al. |
| 6,462,802 B1 | 10/2002 | Nishimura et al. |
| 6,475,836 B1 | 11/2002 | Suzawa et al. |
| 6,498,369 B1 | 12/2002 | Yamazaki et al. |
| 6,501,098 B2 | 12/2002 | Yamazaki |
| 6,515,336 B1 | 2/2003 | Suzawa et al. |
| 6,529,251 B2 | 3/2003 | Hibino |
| 6,534,826 B2 | 3/2003 | Yamazaki |
| 6,545,359 B1 | 4/2003 | Ohtani et al. |
| 6,576,926 B1 | 6/2003 | Yamazaki et al. |
| 6,599,791 B1 | 7/2003 | Koyama et al. |
| 6,617,644 B1 | 9/2003 | Yamazaki et al. |
| 6,620,661 B2 | 9/2003 | Maekawa et al. |
| 6,646,288 B2 | 11/2003 | Yamazaki et al. |
| 6,744,070 B2 | 6/2004 | Shimada et al. |
| 6,753,257 B2 | 6/2004 | Yamazaki |
| 6,784,455 B2 | 8/2004 | Maekawa et al. |
| 6,809,021 B2 | 10/2004 | Ohtani et al. |
| 6,861,670 B1 | 3/2005 | Ohtani et al. |
| 6,967,129 B2 | 11/2005 | Yamazaki et al. |
| 6,998,282 B1 | 2/2006 | Yamazaki et al. |
| 7,015,141 B2 | 3/2006 | Yamazaki |
| 7,064,020 B2 | 6/2006 | Yamazaki |
| 7,145,173 B2 | 12/2006 | Koyama et al. |
| 7,259,427 B2 | 8/2007 | Yamazaki et al. |
| 7,279,711 B1 | 10/2007 | Yamazaki et al. |
| 7,361,519 B2 | 4/2008 | Yamazaki et al. |
| 7,375,782 B2 | 5/2008 | Yamazaki et al. |
| 7,411,211 B1 | 8/2008 | Yamazaki |
| 7,420,211 B2 | 9/2008 | Ohtani et al. |
| 7,425,931 B1 | 9/2008 | Yamazaki et al. |
| 7,573,069 B2 | 8/2009 | Yamazaki |
| 7,626,202 B2 | 12/2009 | Yamazaki |
| 7,663,238 B2 | 2/2010 | Yamazaki |
| 7,858,987 B2 | 12/2010 | Yamazaki |
| 7,923,779 B2 | 4/2011 | Yamazaki et al. |
| 7,956,359 B2 | 6/2011 | Yamazaki |
| 7,956,362 B2 | 6/2011 | Yamazaki |
| 8,003,989 B2 | 8/2011 | Nakajima et al. |
| 8,023,055 B2 | 9/2011 | Nakajima et al. |
| 8,097,884 B2 | 1/2012 | Yamazaki |
| 8,421,135 B2 | 4/2013 | Yamazaki |
| 2001/0030322 A1 | 10/2001 | Yamazaki et al. |
| 2001/0045995 A1 | 11/2001 | Numano |
| 2001/0049197 A1 | 12/2001 | Yamazaki et al. |
| 2001/0052950 A1 | 12/2001 | Yamazaki et al. |
| 2001/0055841 A1 | 12/2001 | Yamazaki et al. |
| 2002/0001886 A1 | 1/2002 | Ohtani |
| 2002/0006705 A1 | 1/2002 | Suzawa et al. |
| 2002/0013022 A1 | 1/2002 | Yamazaki et al. |
| 2002/0016028 A1 | 2/2002 | Arao et al. |
| 2002/0017685 A1 | 2/2002 | Kasahara et al. |
| 2002/0063287 A1 | 5/2002 | Yamazaki |
| 2002/0070382 A1 | 6/2002 | Yamazaki et al. |
| 2002/0086471 A1 | 7/2002 | Maekawa et al. |
| 2002/0090801 A1 | 7/2002 | Maekawa et al. |
| 2002/0106861 A1 | 8/2002 | Yamazaki |
| 2002/0110941 A1 | 8/2002 | Yamazaki et al. |
| 2002/0139980 A1 | 10/2002 | Yamazaki |
| 2002/0163035 A1 | 11/2002 | Yamazaki |
| 2002/0164843 A1 | 11/2002 | Yamazaki et al. |
| 2002/0190334 A1 | 12/2002 | Shimada et al. |
| 2003/0052336 A1 | 3/2003 | Yamazaki et al. |
| 2003/0060057 A1 | 3/2003 | Raaijmakers et al. |
| 2003/0129791 A1 | 7/2003 | Yamazaki |
| 2003/0197179 A1 | 10/2003 | Yamazaki et al. |
| 2004/0051142 A1 | 3/2004 | Yamazaki et al. |
| 2004/0147065 A1 | 7/2004 | Kitakado et al. |
| 2004/0214439 A1 | 10/2004 | Yamazaki |
| 2005/0040401 A1 | 2/2005 | Yamazaki et al. |
| 2005/0098894 A1 | 5/2005 | Ohtani et al. |
| 2005/0139831 A1 | 6/2005 | Koyama et al. |
| 2005/0162421 A1 | 7/2005 | Yamazaki et al. |
| 2005/0162578 A1 | 7/2005 | Yamazaki et al. |
| 2006/0081931 A1 | 4/2006 | Yamazaki et al. |
| 2006/0121736 A1 | 6/2006 | Yamazaki |
| 2006/0231846 A1 | 10/2006 | Hong |
| 2007/0200113 A1 | 8/2007 | Yamazaki et al. |
| 2008/0048189 A1 | 2/2008 | Yamazaki et al. |
| 2008/0309585 A1 | 12/2008 | Yamazaki et al. |
| 2009/0033818 A1 | 2/2009 | Nakajima et al. |
| 2011/0169003 A1 | 7/2011 | Yamazaki |
| 2011/0233554 A1 | 9/2011 | Yamazaki |
| 2011/0241012 A1 | 10/2011 | Yamazaki et al. |

FOREIGN PATENT DOCUMENTS

| | | |
|---|---|---|
| EP | 0629003 A1 | 12/1994 |
| EP | 1001467 A2 | 5/2000 |
| EP | 1005094 A2 | 5/2000 |
| EP | 1006589 A2 | 6/2000 |
| EP | 1031873 A2 | 8/2000 |
| EP | 1041622 A1 | 10/2000 |
| EP | 1041641 A2 | 10/2000 |
| EP | 1045447 A2 | 10/2000 |
| EP | 1049167 A2 | 11/2000 |
| EP | 2256808 A2 | 12/2010 |
| JP | 56-024925 A | 3/1981 |
| JP | 60-105216 A | 6/1985 |

(56) References Cited

FOREIGN PATENT DOCUMENTS

| | | |
|---|---|---|
| JP | 01-241162 A | 9/1989 |
| JP | 04-011722 A | 1/1992 |
| JP | 06-013610 A | 1/1994 |
| JP | 06-148685 A | 5/1994 |
| JP | 06-267978 A | 9/1994 |
| JP | 06-338615 A | 12/1994 |
| JP | 07169967 A | 7/1995 |
| JP | 07-235680 A | 9/1995 |
| JP | 07-297407 A | 11/1995 |
| JP | 08-274336 A | 10/1996 |
| JP | 10-048651 A | 2/1998 |
| JP | 11-271792 A | 10/1999 |
| JP | 2000-36465 A | 2/2000 |
| JP | 2000-81632 A | 3/2000 |
| JP | 2000-195863 A | 7/2000 |
| JP | 2000-216396 A | 8/2000 |
| JP | 2000-228527 A | 8/2000 |
| JP | 2000-252473 A | 9/2000 |
| JP | 2000-269505 A | 9/2000 |
| JP | 2000-311897 A | 11/2000 |
| JP | 2000-349301 A | 12/2000 |
| JP | 2001-013525 A | 1/2001 |
| JP | 2001-053283 A | 2/2001 |
| KR | 2001-0015419 A | 2/2001 |
| WO | 97-36324 A1 | 10/1997 |

OTHER PUBLICATIONS

Australian Patent Office Search Report (Application No. SG 200200805-0), dated Feb. 16, 2004, 8 pages.

Caune S. et al.; "Combined CW Laser and Furnace Annealing of Amorphous Si and Ge in Contact with some Metals"; Applied Surface Science, vol. 36, pp. 597-604 (1989).

First Office Action (Patent Application No. 200410092710.8) dated Aug. 11, 2006, Patent Office of the People's Republic of China (6 pages).

M. Fuse et al.; "Performance of Poly-Si Thin Film Transistors Fabricated by Excimer-Laser Annealing of SiH4- and Si2H6-Source Low Pressure Vapor Deposited a-Si Films with or without Solid-Phase Crystallization"; Solid State Phenomena, vols. 37-38; pp. 565-570 (1994).

Sorab Ghandhi; "Thermal Oxidation of Gallium Arsenide"; VLSI Fabrication Principles—Silicon and Gallium Arsenide; 2nd Edition, pp. 484, 485, 533-535 (1994).

L. Hultman et al.; "Crystallization of Amorphous Silicon During Thin-film Gold Reaction"; J. Appl. Phys., vol. 62, No. 9; pp. 3647-3655 (Nov. 1987).

Yunosuke Kawazu et al.; "Low-Temperature Crystallization of Hydrogenated Amorphous Silicon Induced by Nickel Silicide Formation"; Japanese Journal of Applied Physics, vol. 29, No. 12; pp. 2698-2704 (1990).

Kenji Sera et al.; "High-Performance TFT's Fabricated by XeCl Excimer Laser Annealing of Hydrogenated Amorphous-Silicon Film"; IEEE Transactions on Electron Device, vol. 36, No. 12; pp. 2868-2872 (Dec. 1989).

Rafael Reif et al.; "Plasma-Enhanced Chemical Vapor Deposition"; Thin Film Processes II; pp. 537-541; (1991).

Search Report and Written Opinion (Singapore Application No. 200601869-1) Dated Feb. 20, 2008 (22 pages).

S.M. Sze; VLSI Technology; 2nd Edition, pp. 85-86, 266-267 (1988).

Hongyong Zhang et al.; KrF Excimer Laser Annealed TFT with Very High Field-Effect Mobility of 329 cm2/v.s; IEEE Electron Device Letters; vol. 13, No. 5; pp. 297-299 (May 1992).

Office Action (Chinese Patent Application No. 200410092710.8) mailed May 22, 2009 with English translation (10 pages).

European Search Report (EP Application No. 02004670.2) dated Jun. 20, 2012, 7 pages.

European Search Report (Application No. 02004670.2) Dated Jan. 20, 2012, in English.

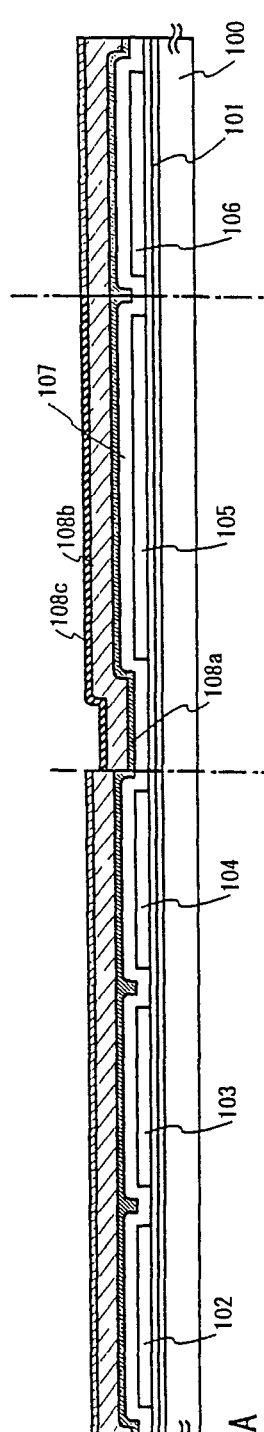
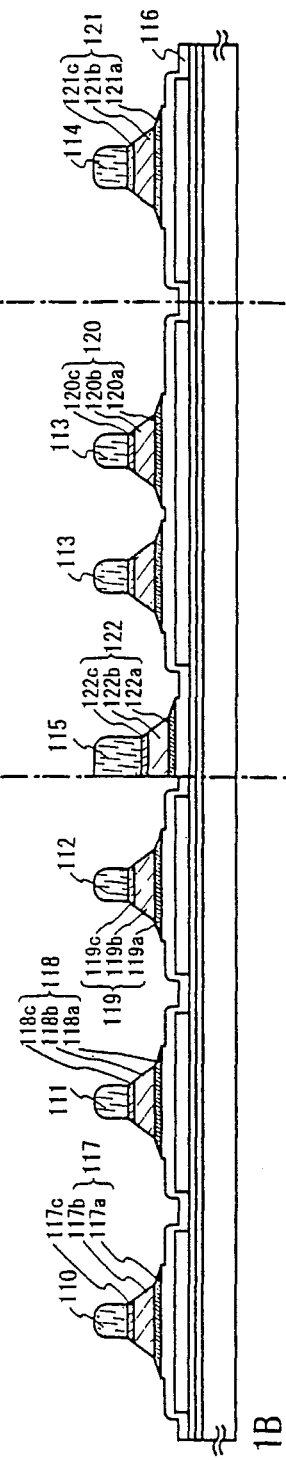
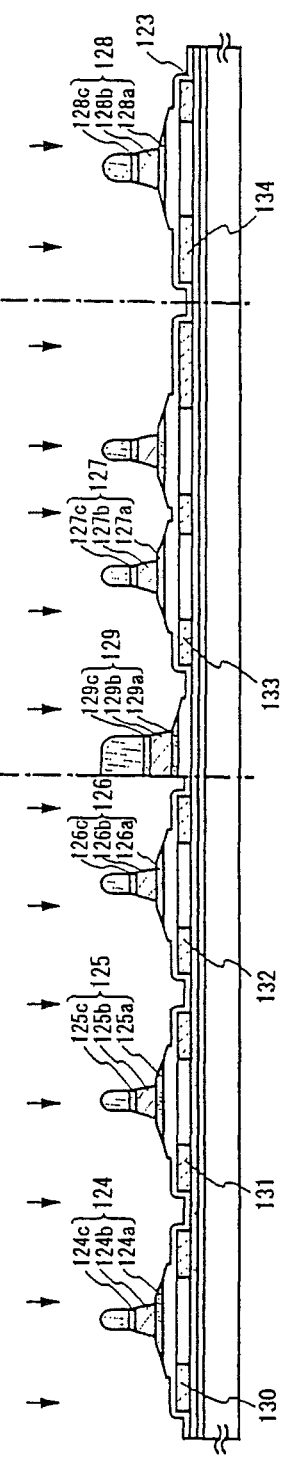
FIG. 1A
FIG. 1B
FIG. 1C

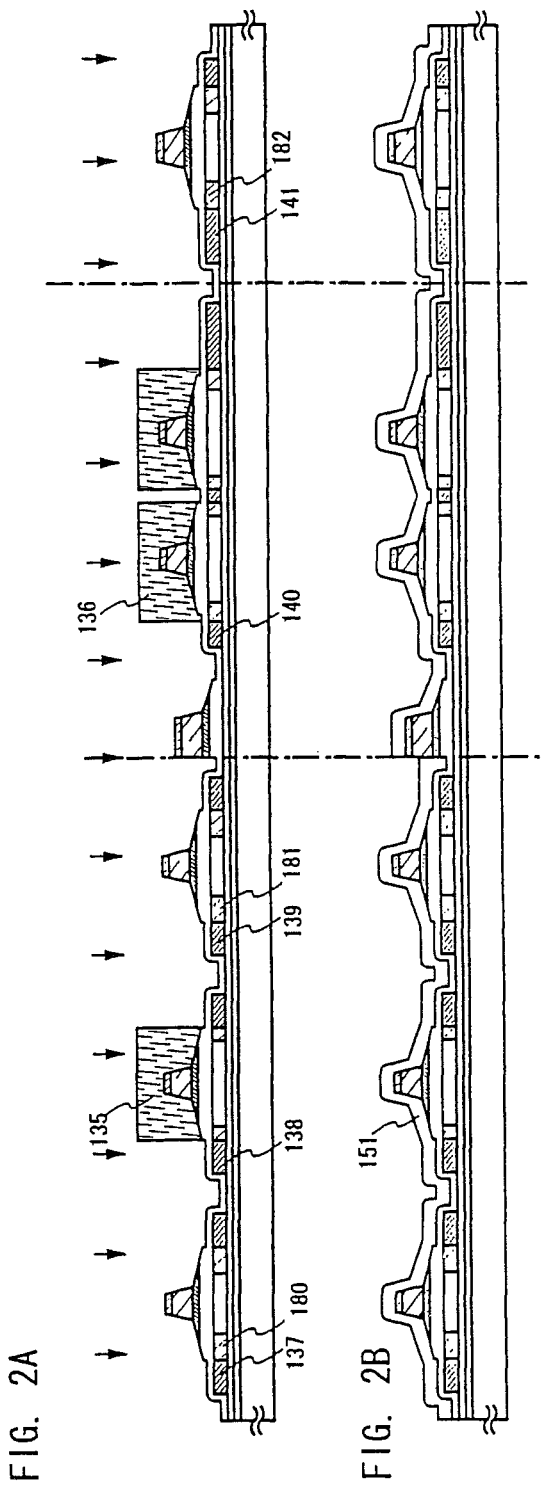

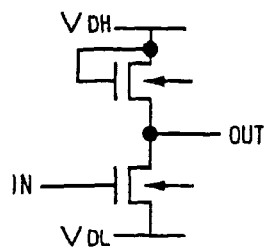 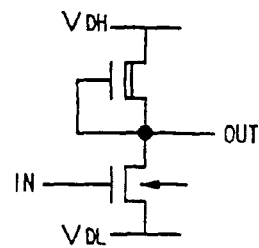
FIG. 7A  FIG. 7B
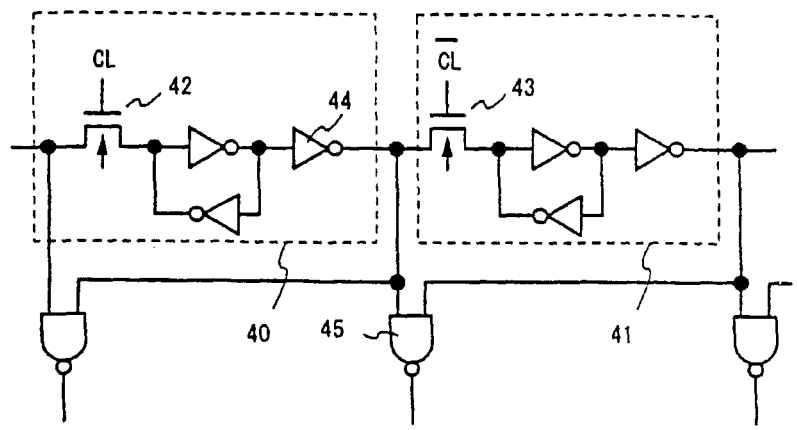
FIG. 8A
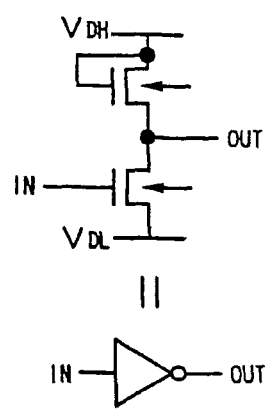 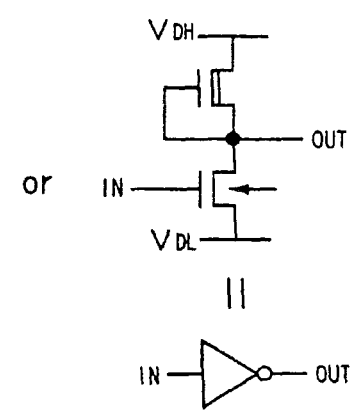
FIG. 8B

SEMICONDUCTOR DEVICE AND MANUFACTURING METHOD THEREOF

CROSS-REFERENCE TO RELATED APPLICATIONS

This application is a continuation of U.S. application Ser. No. 12/124,385, filed May 21, 2008, now allowed, which is a continuation of U.S. application Ser. No. 10/978,512, filed Nov. 2, 2004, now U.S. Pat. No. 7,405,115, which is a continuation of U.S. application Ser. No. 10/718,584, filed Nov. 24, 2003, now U.S. Pat. No. 6,984,550, which is a divisional of U.S. application Ser. No. 10/078,489, filed Feb. 21, 2002, now U.S. Pat. No. 6,657,260, which claims the benefit of foreign priority applications filed in Japan as Serial No. 2001-056063 on Feb. 28, 2001 and Serial No. 2001-302687 on Sep. 28, 2001, all of which are incorporated by reference.

BACKGROUND OF THE INVENTION

1. Field of the Invention

The present invention relates to a semiconductor device having a circuit composed of thin film transistors (hereinafter referred to as TFTs) and a manufacturing method thereof. The present invention relates to, for example, a device represented by a liquid crystal display device (on which a liquid crystal module is mounted) and an electronic device on which such a device is mounted as a part.

Note that the semiconductor device in this specification indicates a device in general, which can function by utilizing a semiconductor characteristic and an electro-optical device, a light emitting device, a semiconductor circuit, and an electronic device each are the semiconductor devices.

2. Description of the Related Art

In recent years, a technique for constructing a thin film transistor (TFT) using a semiconductor thin film (about several to several hundreds nm in thickness) formed on a substrate having an insulating surface has been noted. The thin film transistor is widely applied to an electronic device such as an IC or an electro-optical device and its development as a switching element of an image display device is particularly demanded.

Conventionally, a liquid crystal display device is known as the image display device. Since a high resolution image is obtained as compared with a passive liquid crystal display device, an active matrix liquid crystal display device is used in many cases. According to the active matrix liquid crystal display device, when pixel electrodes arranged in matrix are driven, a display pattern is formed on a screen. In more detail, when a voltage is applied between a selected pixel electrode and an opposite electrode corresponding to the selected pixel electrode, a liquid crystal layer located between the pixel electrode and the opposite electrode is optically modulated and the optical modulation is recognized as the display pattern by an observer.

The range, of use of such an active matrix liquid crystal display device is increased. Demands for a higher resolution, a higher opening ratio, and high reliability are increased along with increase in a screen size. Simultaneously, demands for improvement of productivity and cost reduction are also increased.

Conventionally, when a TFT is manufactured using aluminum as a material of a gate wiring of the above-mentioned TFT, a protrusion such as hillock or a whisker is produced by thermal treatment and an aluminum atom is diffused to a channel forming region. Thus, an operation failure of the TFT and a deterioration of a TFT characteristic are caused. In order to solve this, a metallic material which can be resistant to thermal treatment, typically, a metallic element having a high melting point is used. However, a problem in which a wiring resistance is increased due to increase in a screen size arises, and increase in power consumption and the like are caused.

SUMMARY OF THE INVENTION

Therefore, an object of the present invention is to provide a structure of a semiconductor device in which low power consumption is realized even when a screen size is increased, and a manufacturing method thereof.

According to the present invention, a gate electrode structure is made to be a laminate structure in which a material film containing mainly TaN or W is used as a first layer for preventing diffusion to a channel forming region, a low resistance material film containing mainly Al or Cu is used as a second layer, and a material film containing mainly Ti is used as a third layer. Thus, a resistance of a wiring is reduced.

According to a structure of the present invention disclosed in this specification, a semiconductor device including a TFT which is composed of a semiconductor layer formed on an insulating surface, an insulating film formed on the semiconductor layer, and a gate electrode formed on the insulating film is characterized by comprising: a pixel portion including a first n-channel TFT having a source wiring made of the same material as the gate electrode; a driver circuit including a circuit which is composed of a second n-channel TFT and a third n-channel TFT; and a terminal portion made of the same material as the gate electrode.

In the above-mentioned structure, the gate electrode is characterized by having a laminate structure of a material film containing mainly TaN (a first layer), a material film containing mainly Al (a second layer), and a material film containing mainly Ti (a third layer). Also, the gate electrode is characterized by having a laminate structure of a material film containing mainly W (a first layer), a material film containing mainly Al (a second layer), and a material film containing mainly Ti (a third layer).

According to such a gate electrode structure, when an ICP (inductively coupled plasma) etching method is used, end portions of the gate electrode can be formed into a taper shape. Note that a taper angle in this specification indicates an angle formed by a horizontal surface and a side surface of a material layer. Also, in this specification, a side surface having the taper angle is called a taper shape and a portion having the taper shape is called a taper portion.

Also, in the above-mentioned structure, the present invention is characterized in that the second n-channel TFT and the third n-channel TFT compose an EEMOS circuit or an EDMOS circuit. The driver circuit of the present invention is made from an NMOS circuit composed of only n-channel TFTs, and the TFTs of the pixel portion are also composed of n-channel TFTs. Thus, a process is simplified. A general driver circuit is designed based on a CMOS circuit composed of an n-channel semiconductor element and a p-channel semiconductor element, which are complementally combined with each other. However, according to the present invention, the driver circuit is composed of a combination of only n-channel TFTs.

Further, in order to achieve the above-mentioned structure, according to a structure of the present invention, there is provided a method of manufacturing a semiconductor device including a driver circuit, a pixel portion, and a terminal portion, which are located on an insulating surface, the method comprising, the steps of:

forming a semiconductor layer on the insulating surface;

forming a first insulating film on the semiconductor layer;

forming a gate electrode, a source wiring of the pixel portion, and an electrode of the terminal portion on the first insulating film;

adding an impurity element for providing an n-type to the semiconductor layer using the gate electrode as a mask to form an n-type impurity region;

etching the gate electrode to faun a taper portion;

forming a second insulating film which covers the source wiring of the pixel portion and the terminal portion; and forming a gate wiring and a source wiring of the driver circuit on the second insulating film.

In the above-mentioned structure, it is characterized in that, in the step of forming the gate electrode, the source wiring of the pixel portion, and the electrode of the terminal portion, a material film containing mainly TaN, a material film containing mainly Al, and a material film containing mainly Ti are formed to be laminated, and then etched using a mask to form the gate electrode, the source wiring of the pixel portion, and the electrode of the terminal portion. Also, in the above-mentioned structure, it is characterized in that, in the step of forming the gate electrode, the source wiring of the pixel portion, and the electrode of the terminal portion, a material film containing mainly W, a material film containing mainly Al, and a material film containing mainly Ti are formed to be laminated, and then etched using a mask to form the gate electrode, the source wiring of the pixel portion, and the electrode of the terminal portion.

Also, according to the present invention, a liquid crystal display device having the pixel portion and the driver circuit as described in the above-mentioned structure or a light emitting device with an OLED having the pixel portion and the driver circuit as described in the above-mentioned structure can be manufactured.

Also, according to the present invention, since a step of manufacturing a p-channel TFT is omitted, a manufacturing step of a liquid crystal display device or a light emitting device is simplified and a manufacturing cost can be reduced.

BRIEF DESCRIPTION OF THE DRAWINGS

In the accompanying drawings:

FIGS. 1A to 1C show manufacturing steps of an AM-LCD;

FIGS. 2A and 2B show manufacturing steps of the AM-LCD;

FIGS. 7A and 7B show structures of NMOS circuits;

FIGS. 8A and 8B show structures of a shift resistor;

DETAILED DESCRIPTION OF THE PREFERRED EMBODIMENTS

Figure 3:
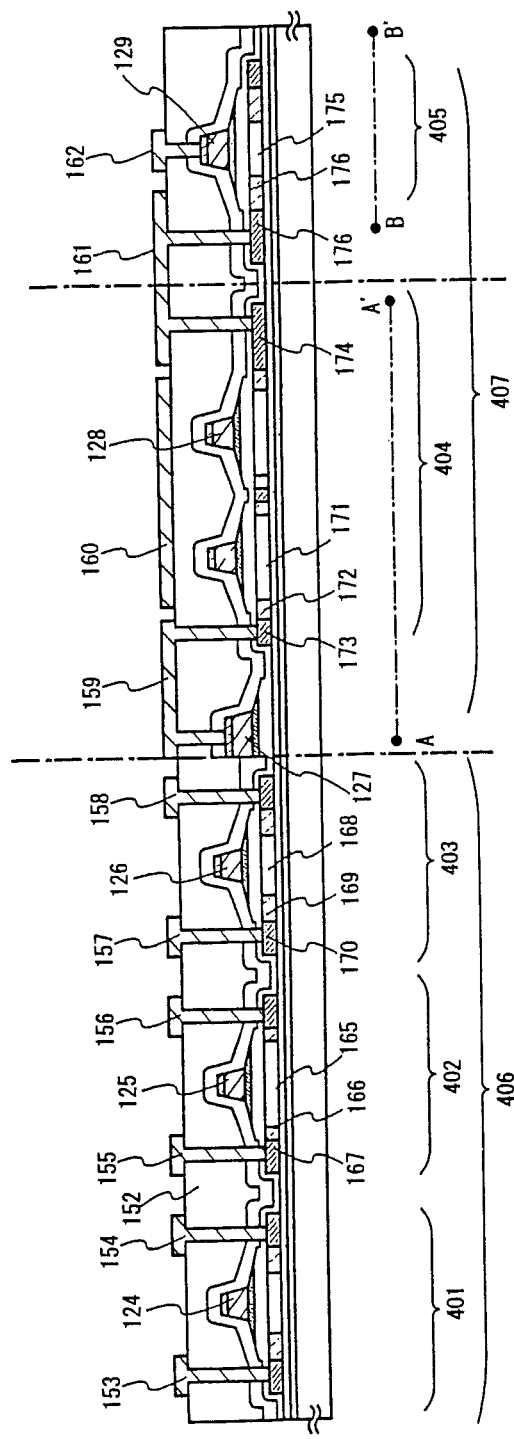
FIG. 3 shows manufacturing steps of the AM-LCD.

An embodiment mode of the present invention will be described below.

First, a base insulating film is formed on a substrate and then a semiconductor layer having a predetermined shape is formed by a first photolithography step.

Next, an insulating film (including a gate insulating film) covering the semiconductor layer is formed. A first conductive film, a second conductive film, and a third conductive film are laminated on the insulating film. First etching processing is performed for the laminated films by a second photolithography step to form a gate electrode made from a first conductive layer and a second conductive layer, a source wiring of a pixel portion, and an electrode of a terminal portion. Note that, in the present invention, after the gate electrode is formed, a gate wiring is formed on an interlayer insulating film.

Next, with a state in which a resist mask formed in the second photolithography step is left as it is, an impurity element (phosphorus or the like) for providing an n-type is added to the semiconductor layer to form n-type impurity regions (having high concentrations) in self alignment.

Next, with a state in which the resist mask formed in the second photolithography step is left as it is, an etching condition is changed and second etching processing is performed to form a first conductive layer (first width), a second conductive layer (second width), and a third conductive layer (third width), which have taper portions. Note that the first width is wider than the second width, and the second width is wider than the third width. Here, an electrode composed of the first conductive layer, the second conductive layer, and the third conductive layer becomes a gate electrode of an n-channel TFT (first gate electrode).

A material film containing mainly TaN or W may be used as the first conductive layer which is in contact with the insulating film in order to prevent diffusion to a channel forming region. Also, a low resistance material film containing mainly Al or Cu may be used as the second conductive layer. Further, a material film containing mainly Ti, which has a low contact resistance, may be used as the third conductive layer.

Next, after the resist mask is removed, an impurity element for providing an n-type is added to the semiconductor layer through the insulating film using the first gate electrode as a mask.

After that, a resist mask is formed by a third photolithography method (step) and an impurity element for providing an n-type is selectively added in order to reduce an off current of a TFT in the pixel portion.

Next, an interlayer insulating film is formed and a transparent conductive film is formed thereon. The transparent conductive film is patterned by a fourth photolithography method (step) to form a pixel electrode. Then, contact holes are formed by a fifth photolithography step. Here, contact holes which reach impurity regions, a contact hole which reaches the gate electrode, and a contact hole which reaches a source wiring are formed.

Next, a conductive film made of a low resistance metallic material is formed. A gate wiring, an electrode for connecting the source wiring and the impurity region, and an electrode for connecting the pixel electrode and the impurity region are formed by a sixth photolithography step. In the present invention, the gate wiring is electrically connected with the first gate electrode or a second gate electrode through a contact hole provided in the interlayer insulating film. Also, the source wiring is electrically connected with the impurity region (source region) through a contact hole provided in the interlayer insulating film. Further, the electrode connected with the pixel electrode is electrically connected with the impurity region (drain region) through a contact hole provided in the interlayer insulating film.

Thus, an element substrate including a pixel portion having a pixel TFT (n-channel TFT) and a driver circuit having an EEMOS circuit (n-channel TFTs) as shown in FIG. 7A can be formed by performing a photolithography step for six times in total, that is, by using six masks. Note that the example in which a transmission type display device is manufactured is indicated here. However, a reflection type display device can be also manufactured using a material having a high reflecting property for the pixel electrode. When the reflection type display device is manufactured, since the pixel electrode can be formed being simultaneous with the gate wiring, the element substrate can be formed by using five masks.

Also, an active matrix light emitting device having an OLED (organic light emitting device) can be manufactured. Even in case of the light emitting device, the whole driver circuit is composed of n-channel TFTs and the pixel portion is also composed of a plurality of n-channel TFTs. In the light emitting device employing the OLED, at least a TFT which functions as a switching element and a TFT for supplying a current to the OLED are provided in each pixel. Irrespective of a circuit structure of a pixel and a driving method, a TFT which is electrically connected with the OLED and supplies a current thereto is made to be an n-channel TFT.

The OLED has a layer including an organic compound (organic light emitting material) in which luminescence produced by applying an electric field thereto (electro luminescence) is obtained (hereinafter referred to as an organic light emitting layer), an anode, and a cathode. The luminescence in the organic compound includes light emission produced when it is returned from a singlet excitation-state to a ground state (fluorescence) and light emission produced when it is returned from a triplet excitation-state to a ground state (phosphorescence). In case of the light emitting device of the present invention, of the above-mentioned light emissions, either light emission may be used or both the light emissions may be used.

Note that in this specification, all layers formed between the anode and the cathode in the OLED are defined as an organic light emitting layer. Concretely, the organic light emitting layer includes a light emitting layer, a hole injection layer, an electron injection layer, a hole transport layer, and an electron transport layer. Basically, the OLED has a structure in which the anode, the light emitting layer, and the cathode are laminated in order. In addition to this structure, there is a case where the OLED has a structure in which the anode, the hole injection layer, the light emitting layer, and the cathode are laminated in order or a structure in which the anode, the hole injection layer, the light emitting layer, the electron transport layer, and the cathode are laminated in order.

Also, when an EDMOS circuit as shown in FIG. 7B is formed by combining an enhancement type and a depletion type, before the formation of the conductive film, a mask is formed in advance, and an element belonging to the group 15 of the periodic table (preferably, phosphorus) or an element belonging to the group 13 of the periodic table (preferably, boron) may be selectively added to the semiconductor layer which is to be the channel forming region. In this case, the element substrate can be formed by using seven masks.

Also, description has been made using the n-channel TFT here. However, it goes without saying that a p-channel TFT can be formed by using a p-type impurity element instead of the n-type impurity element. In this case, the whole driver circuit is composed of p-channel TFTs and the pixel portion is also composed of the p-channel TFTs.

The present invention made by the above structure will be described in more detail based on the following embodiments.

EMBODIMENT

Embodiment 1

An embodiment of the present invention will be described using FIGS. 1A to 1C to FIG. 6. Here, a method of simultaneously manufacturing TFTs composing a pixel portion and TFTs (only n-channel TFTs) composing a driver circuit provided in a periphery of the pixel portion on the same substrate will be described in detail.

In FIG. 1A, a glass substrate, a quartz substrate, a ceramic substrate, or the like can be used as a substrate 100. A silicon substrate, a metallic substrate, or a stainless substrate, in which an insulating film is formed on the surface, may also be used. Also, a plastic substrate having a heat resistance, which is resistant to a processing temperature in this embodiment may be used.

Then, as shown in FIG. 1A, a base insulating film 101 made from an insulating film such as a silicon oxide film, a silicon nitride film, or a silicon oxynitride film ($SiO_xN_y$) is formed on the substrate 100. As a typical example, a laminate structure is used in which a two-layered structure is used for the base insulating film 101, and a first silicon oxynitride film 101a is formed with a thickness of 50 nm to 100 nm using $SiH_4$, $NH_3$, and $N_2O$ as reactive gases and a second silicon oxynitride film 101b is formed with a thickness of 100 nm to 150 nm using. $SiH_4$, and $N_2O$ as reactive gases. Also, a silicon nitride film having a film thickness of 10 nm or less may be used as the base insulating film 101. When the silicon nitride film is used, it has an effect of improving gettering efficiency in a gettering step which will be performed later in addition to an effect such as a blocking layer. Nickel tends to move to a region having a high oxygen concentration at gettering. Thus, it is extremely effective to use the silicon nitride film as the base insulating film which is in contact with a semiconductor film. Also, a three-layered structure may be used in which the first silicon oxynitride film, the second silicon oxynitride film, and the silicon nitride film are laminated in order.

The semiconductor film as an active layer is obtained by crystallizing an amorphous semiconductor film formed on the base insulating film 101. The amorphous semiconductor film is formed with a thickness of 30 nm to 60 nm. After that, a metallic element (nickel in this embodiment) having, a catalytic action for promoting crystallization is used and a nickel acetate solution including nickel at 1 ppm to 100 ppm in weight conversion is applied onto the surface of the amorphous semiconductor film with a spinner to form a catalytic contained layer.

With keeping a state in which the amorphous semiconductor film is in contact with the catalytic element contained layer, thermal treatment for crystallization is performed. In this embodiment, the thermal treatment is performed by an RTA method. A lamp light source for heating is tuned on for 1 second to 60 seconds, preferably, 30 seconds to 60 seconds and this operation is repeated for 1 time to 10 times, preferably, for 2 times to 6 times. Although the light emission intensity of the lamp light source is set to be an arbitrary intensity, the semiconductor film is heated so as to be instantaneously heated at 600° C. to 1000° C., preferably, about 650° C. to 750° C. Even if such a high temperature is obtained, the semiconductor film is just heated in a moment and there is no case where the substrate 100 itself is distorted and deformed. In this way, the amorphous semiconductor film can be crystallized to obtain the crystalline semiconductor film.

In order to increase a crystallization ratio (a percentage of crystalline components in the entire volume of the film) further and to repair a defect left in a crystal grain, laser light is irradiated to the crystalline semiconductor film. As the laser light, excimer laser light having a wavelength of 400 nm or less, a second harmonic of a YAG laser, or a third harmonic thereof can be also used. In any of the cases, pulse laser light having a repetition frequency of about 10 Hz to 1000 Hz is used, the laser light is condensed to be 100 mJ/cm$^2$ to 400 mJ/cm$^2$ by an optical system, and laser processing for a crystalline semiconductor film 104 may be performed at an overlap ratio of 90% to 95%.

Note that an example using the pulse laser is indicated here. However, a continuous oscillation laser may also be used. In order to obtain a crystal with a large grain size at crystallization of the amorphous semiconductor film, it is preferable that a solid laser capable of producing continuous oscillation is used and one of a second harmonic to a fourth harmonic of a fundamental wave is applied. Typically, a second harmonic (532 nm) or a third harmonic (355 nm) of an Nd:YVO$_4$ laser (fundamental wave: 1064 nm) may be applied. When the continuous oscillation laser is used, laser light emitted from the continuous oscillation YVO$_4$ laser having an output of 10 W is converted into a harmonic by a non-linear optical element. Also, there is a method of locating a YVO$_4$ crystal and a non-linear optical element in a resonator and emitting a harmonic. Then, laser light is preferably formed into a rectangular shape or an elliptical shape on an irradiating surface by an optical system and irradiated to an object to be processed. At this time, an energy density of about 0.01 MW/cm$^2$ to 100 MW/cm$^2$ (preferably, 0.1 MW/cm$^2$ to 10 MW/cm$^2$) is required. Then, the semiconductor film may be moved relatively to laser light at a speed of about 10 cm/s to 2000 cm/s to be irradiated.

Note that a technique for irradiating laser light after thermal crystallization using nickel as a metallic element for promoting crystallization of silicon is used here. However, an amorphous silicon film may be crystallized by the continuous oscillation laser (the second harmonic of the YVO$_4$ laser) without adding nickel thereto.

Next, the following gettering processing is performed to remove a catalytic element included in the crystalline semiconductor film. A barrier layer is formed on the crystalline semiconductor film. As the barrier layer, a porous film is formed such that the catalytic element (nickel) can be moved to a gettering cite by thermal treatment and further an etching solution used in a step of removing the gettering cite does not penetrate. For example, a chemical oxide film formed by processing using ozone water or a silicon oxide (SiO$_x$) film may be used. In this specification, a film having such a property is particularly called a porous film.

Next, a semiconductor film including a noble gas element is formed as a gettering cite. In this embodiment, at a stage of film formation by a plasma CVD method, a sputtering method, or the like or at a stage of addition by an ion doping method or an ion implantation method after the film formation, a semiconductor film including a noble gas element at a concentration of $1\times10^{19}$/cm$^3$ to $1\times10^{22}$/cm$^3$, preferably, $1\times10^{20}$/cm$^3$ to $1\times10^{21}$/cm$^3$ is formed.

After that, thermal treatment such as an RTA method using a lamp light source or thermal treatment using a furnace is performed to move the catalytic element to the gettering cite in a longitudinal direction. This thermal treatment also serves as anneal. With respect to a heating condition, a lamp light source for heating is tuned on for 1 second to 60 seconds, preferably, 30 seconds to 60 seconds, and this operation is repeated 1 time to 10 times, preferably, 2 times to 6 times. Although the light emission intensity of the lamp light source is set to be an arbitrary intensity, the semiconductor film is heated so as to be instantaneously heated at 600° C. to 1000° C., preferably, about 700° C. to 750° C.

After the completion of the gettering step, the gettering cite made, of the amorphous semiconductor is selectively etched to remove it. As an etching method, dry etching without plasma by ClF$_3$ or wet etching by an alkali solution such as an aqueous solution including hydrazine or tetraethylammonium hydroxide (chemical formula: (CH$_3$)$_4$NOH) can be used. At this time, a barrier layer 106 functions as an etching stopper. Also, the barrier layer 106 may be removed by hydrofluoric acid in a later step. In order to improve the crystallization, laser light may be irradiated after the crystallization step.

After that, the obtained crystalline semiconductor film is processed by etching in a predetermined shape to form semiconductor layers 102 to 106 separated in an island shape.

After the semiconductor layers 102 to 106 are formed, an impurity element for providing a p-type may be added thereto in order to control a threshold value (Vth) of an n-channel TFT. An element belonging to the group 13 of the periodic table, such as boron (B), aluminum (Al), or gallium (Ga) is known as the impurity element for providing a p-type to a semiconductor.

Next, a gate insulating film 107 covering the semiconductor layers 102 to 106 separated in an island shape is formed. The gate insulating film 107 is formed by a plasma CVD method or a sputtering method and made from an insulating film including silicon, having its thickness set to be 40 nm to 150 nm. Of course, the gate insulating film 107 can be used as a single layer of the insulating film including silicon or a laminate structure thereof.

When a silicon oxide film is used, TEOS (tetraethyl ortho silicate) and O$_2$ are mixed by a plasma CVD method, a reactive pressure is set to be 40 Pa, and a substrate temperature is set to be 300° C. to 400° C. Then, discharge is performed at a high frequency (13.56 MHZ) power density of 0.5 W/cm$^2$ to 0.8 W/cm$^2$ to form the silicon oxide film. After that, when thermal anneal is performed for the thus formed silicon oxide film at 400° C. to 500° C., a preferable property as the gate insulating film can be obtained.

A tungsten (W) film 108a as a first conductive film having a film thickness of 20 nm to 100 nm, an aluminum (Al) film 108b as a second conductive film having a film thickness of 100 nm to 500 nm, and a titanium (Ti) film 108c having a film thickness of 20 nm to 100 nm are laminated on the gate insulating film 107. Here, a tungsten film having a film thickness of 50 nm, a film of an alloy (Al—Ti) of aluminum and titanium having a film thickness of 500 nm, and a titanium film having a film thickness of 30 nm are laminated in order on the gate insulating film 107.

A conductive material for forming the gate electrode is made from an element selected from the group consisting of Ta, W, Ti, Mo, Al, and Cu, an alloy material including mainly the above element, or a compound material including mainly the above element. A semiconductor film represented by a polycrystalline silicon film doped with an impurity element such as phosphorus may be also used as the first conductive film. Also, there may be employed a combination in which the first conductive film is made from a tungsten (W) film, the second conductive film is made from a Cu film, and the third conductive film is made from a titanium (Ti) film, a combination in which the first conductive film is made from a tantalum nitride (TaN) film, the second conductive film is made from an aluminum (Al) film, and the third conductive film is made from a titanium (Ti) film, a combination in which the first conductive film is made from a tantalum nitride (TaN) film, the second conductive film is made from an Al film, and a combination in which the first conductive film is made from a tantalum nitride (TaN) film, the second conductive film is made from a Cu film, and the third conductive film is made from a titanium (Ti) film.

Next, as shown in FIG. 1B, masks 110 to 115 made of resists are formed by a light exposure step, and first etching processing is performed for forming a gate electrode and a wiring. The first etching processing is performed under a first etching condition and a second etching, condition. For this etching, an ICP (inductively coupled plasma) etching method is preferably used. When the ICP etching method is used and an etching condition (the amount of power applied to a coil type electrode, the amount of power applied to an electrode located in a substrate side, a temperature of the electrode located in the substrate side, and the like) is controlled appropriately, a film can be etched in a predetermined taper shape. Note that a chlorate system gas represented by $Cl_2$, $BCl_3$, $SiCl_4$, $CCl_4$, and the like, a fluorine system gas represented by $CF_4$, $SF_6$, $NF_3$, and the like, or $O_2$ can be used as etching gases appropriately.

Although the etching gas to be used is not limited, it is suitable to use $BCl_3$, $Cl_2$, and $O_2$ here. A ratio of their respective gas flow rates is set to be 65:10:5 (sccm). RF power having 450 W and 13.56 MHZ is supplied to a coil type electrode at a pressure of 1.2 Pa to produce plasma, and etching is performed for 117 seconds. Also, RF power having 300 W and 13.56 MHZ is supplied to a substrate side (sample stage) to apply a substantially negative self bias voltage. Note that an area size of the electrode located in the substrate side is 12.5 cm×12.5 cm. Also, the coil type electrode (here, quartz disk in which a coil is provided) is a disk and an area size thereof is 25 cm in diameter. The W film is etched under the first etching condition to form end portions of the first conductive layer into taper shapes.

After that, the first etching condition is changed to the second etching condition. $CF_4$, $Cl_2$, and $O_2$ are used as etching gases and a ratio of their respective gas flow rates is set to be 25:25:10 (sccm). RF power having 500 W and 13.56 MHZ is supplied to the coil type electrode at a pressure of 1 Pa to produce plasma, thereby performing etching for about 30 seconds. Also, RF power having, 20 W and 13.56 MHZ is supplied to the substrate side (sample stage) to apply a substantially negative self bias voltage. In the second etching condition in which $CF_4$ and $Cl_2$ are mixed, both the W film and the TaN film are etched to the same degree. Note that, in order to perform etching without leaving a residue on the gate insulating film, an etching time is preferably increased at a rate of about 10% to 20%.

In the first etching processing, when shapes of the masks made of resists are suitable, the end portions of the first and the second conductive layers become taper shapes by an effect of the bias voltage which is applied to the substrate side. An angle of the taper portions becomes 15° to 45°. In this way, first shaped conductive layers 117 to 122 made from the first conductive layers, the second conductive layers, and the third conductive layers (first conductive layers 117a to 122a, second conductive layers 117b to 122b, and third conductive layers 117c to 122c) are formed by the first etching processing. Reference numeral 116 denotes a gate insulating film. Regions which are not covered with the first shaped conductive layers 117 to 122 are etched at about 20 nm to 50 nm to form thinner regions.

Figure 13:
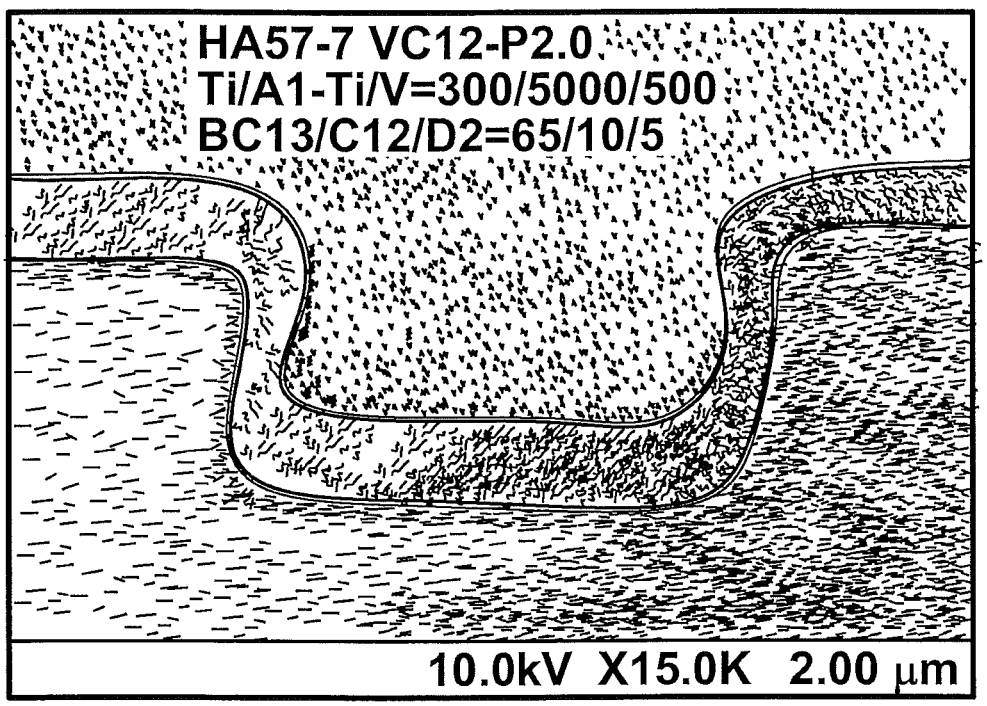
FIG. 13 is an observation SEM picture after etching.

Here, a sample is prepared and an experiment on the etching condition is performed. With respect to the sample, a tungsten film having a film thickness of 50 nm, a film of an alloy (Al—Ti) of aluminum and titanium having a film thickness of 500 nm, and a titanium film having a film thickness of 30 nm are laminated in order on a quartz substrate as in the case of this embodiment. FIG. 13 is a picture obtained by observing the sample using an SEM immediately after etching is performed under the same condition as the above-mentioned first etching processing. Thus, the shape of the conductive layer shown in FIG. 13 can be assumed as the first shaped conductive layer.

Second etching processing is performed as shown in FIG. 1C without removing the masks 110 to 115 made of resists. $BCl_3$ and $Cl_2$ are used as etching gases and a ratio of their respective gas flow rates is set to be 20/60 (sccm). RF power having 600 W and 13.56 MHZ is supplied to the coil type electrode at a pressure of 1.2 Pa to produce plasma, thereby performing etching. Also, RF power having 100 W and 13.56 MHZ is supplied to the substrate side (sample stage). The second conductive layers are etched under a third etching condition performed in the second etching processing. In this way, the aluminum films including a very small amount of titanium are anisotropically etched under the above-mentioned third etching condition to form second shaped conductive layers 124 to 129 (first conductive layers 124a to 129a, second conductive layers 124b to 129b, and third conductive layers 124c to 129c). Reference numeral 123 denotes a gate insulating film. Regions which are not covered with the second shaped conductive layers 124 to 129 are slightly etched to form thinner regions. Also, as shown in FIGS. 1B and 1C, it is assumed that the taper portions of the first conductive layers have identical lengths. However, actually, because of dependency of a wiring width, the lengths of the taper portions of the first conductive layer are altered depending on the wiring width.

Figure 14:
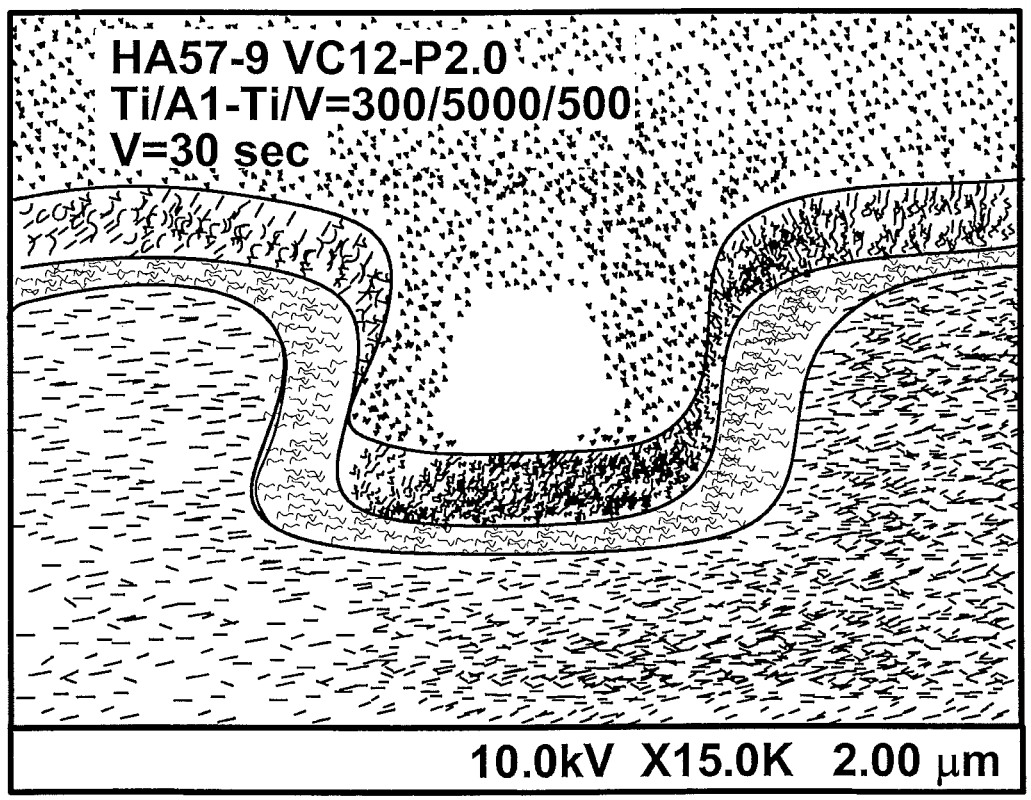
FIG. 14 is an observation SEM picture after etching.

Here, as in the above case, a sample is prepared and an experiment on the etching condition is performed. As the sample, a tungsten film having a film thickness of 50 nm, a film of an alloy (Al—Ti) of aluminum and titanium having a film thickness of 500 nm, and a titanium film having a film thickness of 30 nm are laminated in order on a quartz substrate as in the case of this embodiment. FIG. 14 is a picture obtained by observing the sample using an SEM immediately after etching is performed under the same condition as the above-mentioned first etching processing and then the second etching processing is performed. Thus, the shape of the conductive layer shown in FIG. 14 can be assumed as the second shaped conductive layer.

Then, first doping processing is performed without removing the masks made of resists to add an impurity element for providing an n-type to the semiconductor layers. The doping processing may be performed by an ion dope method or an ion implantation method. With respect to a condition of the ion dope method, a dose is set to be $1.5\times10^{14}$ atoms/cm$^2$ and an accelerating voltage is set to be 60 keV to 100 keV. An element belonging to the group 15, typically, phosphorus (P) or arsenic (As) is used as the impurity element for providing an n-type. In this case, the conductive layers 124 to 128 become masks to the impurity element for providing an n-type and thus first impurity regions 123 to 127 are formed in self alignment. The impurity element for providing an n-type is added to the first impurity regions 130 to 134 at a concentration range of $1\times10^{16}/cm^3$ to $1\times10^{17}/cm^3$.

Next, as shown in FIG. 2A, masks 135 and 136 made of resists are formed and second doping processing is performed. The mask 135 is a mask for protecting the channel forming region of the semiconductor layer composing one of n-channel TFTs in the driver circuit and peripheral regions thereof. The mask 136 is a mask for protecting the channel forming region of the semiconductor layer composing a TFT in the pixel portion and peripheral regions thereof. Also, in FIG. 2A, for convenience' sake, it is assumed that the taper portions of the first conductive layers have identical lengths. However, actually, the lengths of the taper portions of the first conductive layer are altered depending on the wiring width. Thus, when a plurality of wirings having different wiring widths are provided on the same substrate, widths of regions to be doped are different from each other.

With respect to a condition of the ion dope method in the second doping processing, a dose is set to be $1.5\times10^{15}$ atoms/$cm^2$, an accelerating voltage is set to be 60 keV to 100 keV, and phosphorus (P) is doped. Here, the impurity regions are formed in the respective semiconductor layers using differences of film thicknesses between the second shaped conductive layers 124 to 128 and the gate insulating film 123. Of course, phosphorus (P) is not added to the regions covered with the masks 135 and 136. In this way, second impurity regions 180 to 182 and third impurity regions 137 to 141 are formed. The impurity element for providing an n-type is added to the third impurity regions 137 to 141 at a concentration range of $1\times10^{20}/cm^3$ to $1\times10^{21}/cm^3$. Also, the second impurity regions are formed at a lower concentration than the third impurity regions by the difference of a film thickness of the gate insulating film. Thus, the impurity element for providing an n-type is added to the second impurity regions at a concentration range of $1\times10^{18}/cm^3$ to $1\times10^{19}/cm^3$.

By the above steps, the impurity regions having conductivity types of n-types are formed in the respective semiconductor layers. The second shaped conductive layers 124 to 127 become gate electrodes. Also, the second shaped conductive layer 128 becomes one electrode composing a storage capacitor in the pixel portion. Further, the second shaped conductive layers 129 composes a source wiring in the pixel portion.

Next, a first interlayer insulating film 151 substantially covering the entire surface is formed. The first interlayer insulating film 151 is formed by a plasma CVD method or a sputtering method, and made from an insulating film containing silicon and hydrogen with a thickness of 100 nm to 200 nm. One preferable example thereof is a silicon oxynitride film having a film thickness of 150 nm, which is formed by a plasma CVD method. Of course, the first interlayer insulating film 151 is not limited to the silicon oxynitride film and may be used as a single layer of other insulating film containing silicon or a laminate structure thereof.

After that, a step of activating the impurity element added to the respective semiconductor layers is performed. The activation is realized by thermal treatment using a furnace anneal or a clean oven. Thermal treatment is performed in a nitrogen atmosphere at a temperature of 400° C. to 700° C., typically, 410° C. to 500° C. Note that, in addition, a laser anneal method or a rapid thermal anneal method (RTA method) can be applied.

Simultaneously with the above-mentioned activation processing, nickel used as a catalyst at crystallization is gettered in the third impurity regions 137 to 141 containing phosphorus at a high concentration to reduce the concentration of nickel in the semiconductor layers as mainly to be the channel forming regions. As a result, with respect to the TFTs having the channel forming regions, an off current value is reduced. Also, high electric field effect mobility is obtained because of its high crystallinity, and a preferable characteristics can be achieved.

Next, as shown in FIG. 3, a second interlayer insulating film 152 made of an organic insulator material is formed on the first interlayer insulating film 151. Then, a contact hole which reaches a source wiring 127 and contact holes which reach the respective impurity regions are formed.

After that, wirings and a pixel electrode, which are made of Al, Ti, Mo, W, or the like are formed. For example, a laminate film of a Ti film having a film thickness of 50 nm to 250 nm and an alloy film (alloy film of Al and Ti) having a film thickness of 300 nm to 500 nm is used. In this way, wirings (source wirings and drain wirings) 153 to 158, a gate wiring 160, a connection wiring 159, a pixel electrode 161, and a capacitor wiring 162 are formed.

In this way, a driver circuit 406 having n-channel TFTs 401, 402, and 403 and a pixel portion 407 having an n-channel TFT 404 and a storage capacitor 405 can be formed on the same substrate. In this specification, such a substrate is called an active matrix substrate for convenience' sake. Note that the n-channel TFT 401 and the n-channel TFT 403 have the same structures.

Also, according to a conventional method, there is a case where the impurity element is moved to a region under the gate electrode depending on a doping condition, and impurity regions which are overlapped with the gate electrode and have a concentration gradient are produced at a width of about 0.1 μm. However, in this embodiment, the width is set to be 0.5 μm or more, preferably, 1 μm or more. Thus, the TFT structure is different from the conventional one.

The n-channel TFT 402 has a channel forming region 165, second impurity regions 166 which are not overlapped with a portion of the second shaped conductive layer 125 composing the gate electrode, and third impurity regions 167 which each function as the source region or the drain region.

The n-channel TFT 403 has a channel forming region 168, second impurity regions 169 which are not overlapped with a portion of the second shaped conductive layer 126 composing the gate electrode, and third impurity regions 170 which each function as the source region or the drain region.

A shift register circuit, a buffer circuit, a level shifter circuit, a latch circuit, and the like are formed by using these n-channel TFTs. In particular, in the case of a buffer circuit having a high drive voltage, the structure of the n-channel TFT 401 or 403 is suitable in order to prevent the deterioration due to a hot carrier effect.

The pixel TFT 404 in the pixel portion 407 has a channel forming region 171, first impurity regions 172 formed outside the second shaped conductive layer 128 composing the gate electrode, and third impurity regions 173 which each function as the source region or the drain region. Further, a third impurity region 176 and a second impurity region 177 are formed in the semiconductor layer which functions as one electrode of the storage capacitor 405. The storage capacitor 405 is composed of, by making the insulating film (the same film as the gate insulating film) as a dielectric, the capacitor wiring 162, and the semiconductor layer 106.

Figure 4:
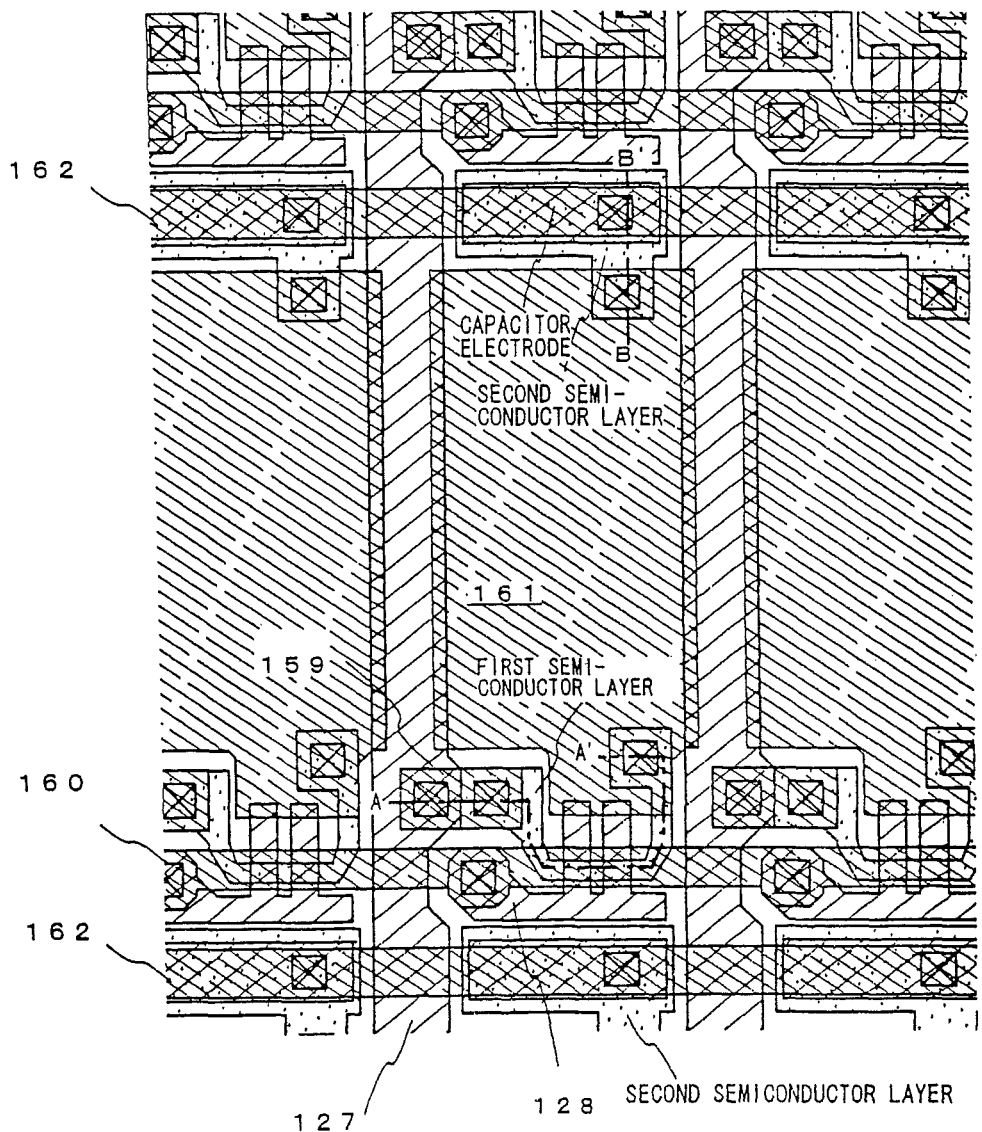
FIG. 4 is a top view of a pixel.

FIG. 4 is a top view of such a pixel portion 407. FIG. 4 is a top view of a substantially one pixel, and reference symbols which are common to those of FIG. 3 are used. Also, cross sectional structures of lines A-A' and B-B' correspond to FIG. 3. In the pixel structure shown in FIG. 4, when the gate wiring and the gate electrode are formed on different layers, the gate wiring and the semiconductor layer can be overlapped. Thus, a function as a light shielding film is added to the gate wiring. Also, in order to shield a gap between pixel electrodes from light, the pixel electrode is located so as to overlap end portions thereof with the source wiring. Thus, a structure capable of omitting a light shielding film (black matrix) is obtained. As a result, an opening ratio can be improved as compared with the conventional pixel portion.

Embodiment 2

In this embodiment, the steps to fabricate a liquid crystal module made from the active matrix substrate obtained in Embodiment 1 are described below.

An orientation film is formed on the active matrix substrate shown in FIG. 3, followed by conducting rubbing processing. In this embodiment, before the orientation film is formed, an organic resin film such as an acrylic resin film is patterned to form column-shaped spacers at desired positions for the purpose of keeping a substrate gap. In place of the column-shaped spacers, spherical spacers may be dispersed over the entire surface of the substrate.

Then, an opposite substrate is prepared. A color filter in which a coloring layer and a light-shielding layer are provided in the manner to correspond to each pixel is formed on the opposite substrate. Further, a light-shielding layer is formed on the driving circuit. And, a flattering film covering the color filter and the light-shielding layer is formed. Then, an opposite electrode made of a transparent conductive film is formed on the flattening film at least in the pixel portion, and an orientation film is formed over the entire surface of the opposite substrate, followed by conducting rubbing.

The active matrix substrate with the pixel portion and the driving circuit formed thereon is attached to the opposite substrate with a sealant. Filler is mixed in the sealant. Two substrates are attached to each other while a uniform gap is kept therebetween with the filler and the column-shaped spacers. Thereafter, a liquid crystal material is injected between the substrates, and completely sealed with a sealant. As the liquid crystal material, a known liquid crystal material may be used. Then, as described above, the liquid crystal module is completed. Further, in case of needed, the active matrix substrate or the opposite substrate are divided into the required shape. Furthermore, a polarizing plate etc. is attached by using known method. Then, a FPC is attached by using known method.

The structure of the liquid crystal module obtained in such manner will be described with reference of a top view of FIG. 5.

Figure 5:
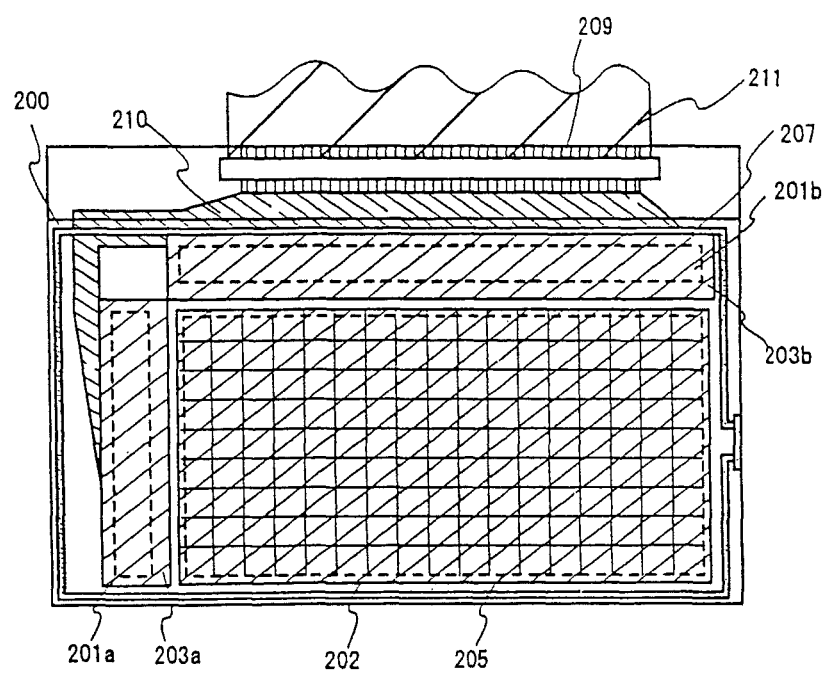
FIG. 5 shows an appearance of a liquid crystal module.

As shown in a top view of FIG. 5, an active matrix substrate is attached to an opposite substrate 200 with a sealant 207. The active matrix substrate is provided with a pixel portion, driving circuits, an external input terminal 209 to which an FPC (Flexible Printed Circuit) 211 is attached, and a wiring 210 connecting the external input terminal to an input portion of each circuit. The opposite substrate 200 is provided with a color filter and the like.

A light-shielding layer 203a is provided on the opposite substrate side so as to be overlapped with a gate-side driving circuit 201a, and a light-shielding layer 803b is provided on the opposite substrate side so as to be overlapped with a source-side driving circuit 201b. A color filter 202 disposed on the pixel portion 205 on the opposite substrate side is provided in such a manner that a light-shielding layer and a coloring layer of each color (red (R), green (G), and blue (B)) correspond to each pixel. In actual, a color display is conducted with three colors of the coloring layer of red (R), the coloring layer of green (G), and the coloring layer of blue (B). The coloring layers of the respective colors are arranged arbitrarily.

Herein, in order to conduct a color display, the color filter 202 is provided on the opposite substrate. However, the present invention is not limited thereto. A color filter may be formed on an active matrix substrate when the active matrix substrate is produced.

In the color filter, a light-shielding layer is provided in a region between the adjacent pixels, whereby light is blocked in the region other than a display region. Furthermore, the light-shielding layers 203a and 203b are provided so as to cover the driving circuits. However, covers will be placed over the regions of the driving circuits when the liquid crystal display apparatus is incorporated into electronic equipment as a display portion. Therefore, the regions of the driving circuits may not be covered with the light-shielding layers. Furthermore, a light-shielding layer may be formed on an active matrix substrate when the active matrix substrate is produced.

Furthermore, the following may also be possible. Instead of providing the above-mentioned light-shielding layers, a plurality of stacked coloring layers constituting a color filter are appropriately disposed between the opposite substrate and the opposite electrode, whereby light is blocked in the region (gap between the respective pixel electrodes) other than a display region and driving circuits.

Furthermore, an FPC 211 composed of a base film and a wiring is attached to the external input terminal with anisotropic conductive resin. Furthermore, the mechanical strength of the apparatus is enhanced with a reinforcing plate.

The liquid crystal module fabricated in the manner as described above can be used for display portion of various electronic devices.

Embodiment 3

Figure 6:
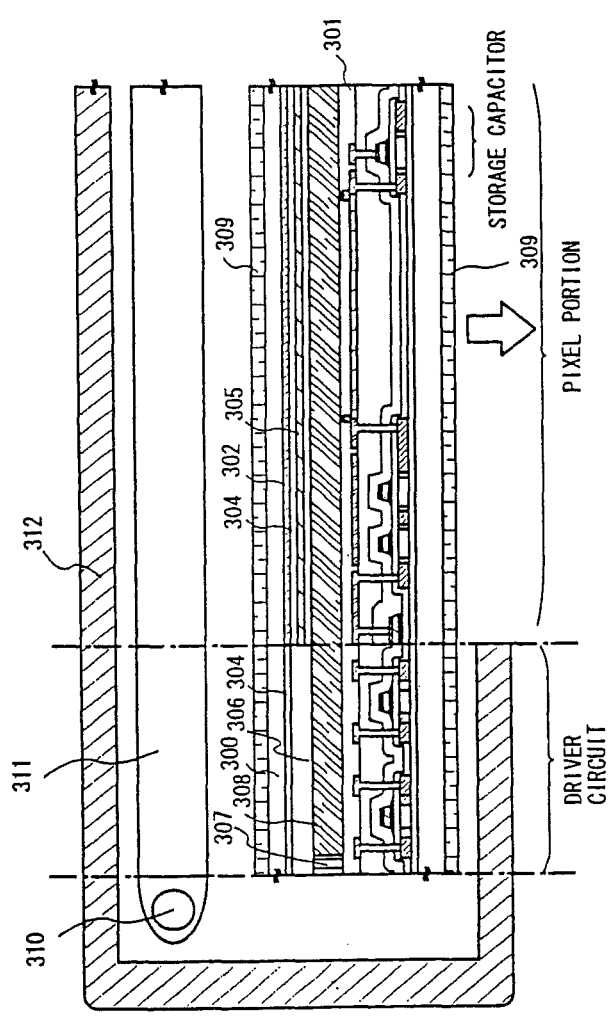
FIG. 6 is a cross sectional view of a transmission type liquid crystal display device.

Embodiment 1 shows an exemplary reflection type display apparatus in which a pixel electrode is made of a metal material with reflectivity. In this embodiment, an exemplary transmission type display apparatus is shown in FIG. 6, in which a pixel electrode is made of a conductive film with light transparency. When the pixel electrode is formed by the transparent conductive film, though one photomask is increased, the transparent type display device can be formed.

After the interlayer insulating film is formed in accordance with Embodiment 1, a pixel electrode made of a conductive film with light transparency is formed. As the conductive film having light transparency, ITO (indium tin oxide alloy), indium zinc oxide alloy ($In_2O_3ZnO$), zinc oxide (ZnO), or the like may be used.

Thereafter, contact holes are formed in the interlayer insulating film. Then, connection electrodes overlapping the pixel electrodes are formed. The connection electrodes are connected to drain regions through contact holes. Furthermore, a source electrode or a drain electrode of another TFT is also formed simultaneously with the connection electrodes.

Herein, an embodiment in which all the driving circuits are formed on a substrate is shown. However, several ICs may be used in a part of a driving circuit.

An active matrix substrate is formed as described above. A liquid crystal module is manufactured in accordance with Embodiment 2, using the active matrix substrate, and a backlight 310 and a light-guiding plate 311 are provided, followed by disposing a cover 312, whereby an active matrix type liquid crystal display apparatus as shown in FIG. 6 is completed. The cover 312 and the liquid crystal module are attached to each other with an adhesive or an organic resin. Furthermore, a substrate may be attached to an opposite substrate by filling an organic resin between a frame and a substrate so as to surround the frame. Since the apparatus is of a transmission type, polarizing plates 309 are attached to both the active matrix substrate and the opposite substrate.

Embodiment 4

In such a case of n-channel type TFT shown in Embodiment 1, elements belonging to the group 15 in the periodic table (preferably, phosphorus) or elements belonging to the group 13 in the periodic table (preferably, boron) may be added to the semiconductor in the channel forming region to selectively fabricate the enhancement type and depletion type.

In a case where an NMOS circuit is formed by combining the n-channel TFTs, it is formed as a combination of enhancement-type TFTs (hereinafter referred to as "EEMOS circuit") or a combination of depletion-type and enhancement-type TFTs (hereinafter referred to as "EDMOS circuit").

FIG. 7A shows an example of the EEMOS circuit, and FIG. 7B shows an example of the EDMOS circuit. Each of components 31 and 32 shown in FIG. 7A is an enhancement type n-channel TFT (hereinafter referred to as "E-type NTFT"). Components 33 shown in FIG. 7B is an E-type NTFT and 34 is a depletion type of n-channel TFT (hereinafter referred to as "D-type NTFT"), respectively.

In FIGS. 7A and 7B, $V_{DH}$ designates a power supply line to which a positive voltage is applied (positive power supply line), and $V_{DL}$ designates a power supply line to which a negative voltage is applied (negative power supply line). The negative power supply line may be a ground-potential power supply line (grounded power supply line).

FIG. 8 shows an example of a shift register formed by using the EEMOS circuit shown in FIG. 7A or the EDMOS circuit shown in FIG. 7B. Portions 40 and 41 of FIG. 8 are flip-flop circuits. Components 42 and 43 are E-type NTFTs. A clock signal (CL) is input to the gate of the E-type NTFT 42, and a clock signal (CL-bar) of the opposite polarity is input to the gate of the E-type NTFT 43. A symbol indicated by 44 represents an inverter circuit. To form this inverter circuit, the EEMOS circuit shown in FIG. 7A or the EDMOS circuit shown in FIG. 7B is used, as shown in FIG. 8B. Therefore all of driver circuits of the display device can be structured by n-channel type TFT.

This embodiment can be combined with either one of Embodiments 1 to 3.

Embodiment 5

Figure 9:
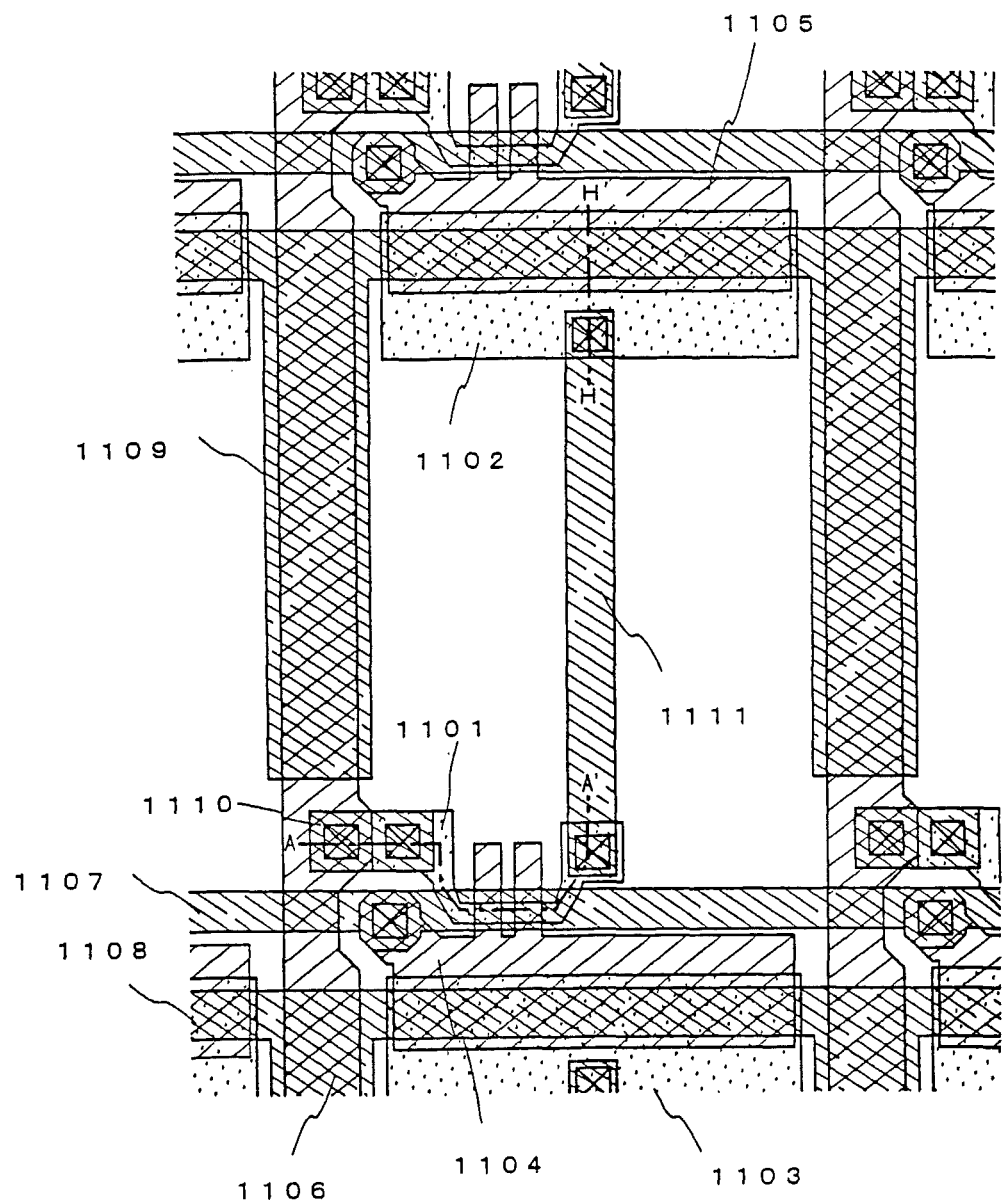
FIG. 9 is a top view of a pixel portion of the present invention.
Figure 10:
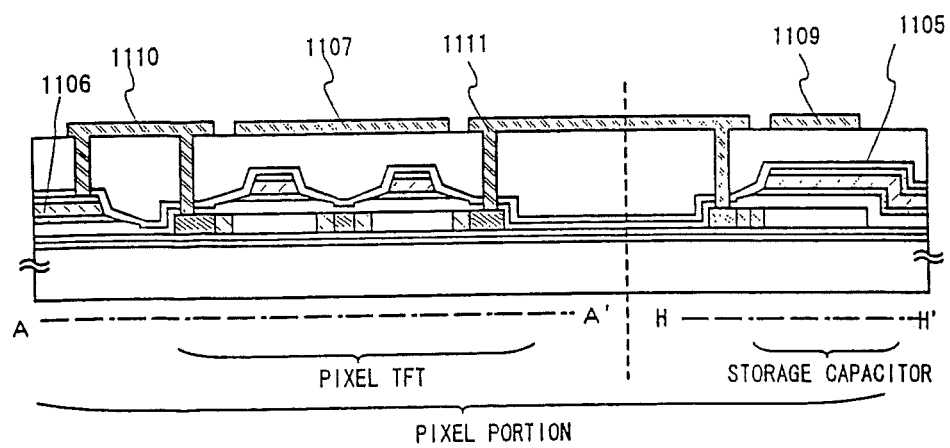
FIG. 10 is a cross sectional view of the pixel portion of the present invention.

In this embodiment, a pixel structure (IPS system) different from Embodiment 1 is shown in FIG. 9 and a cross sectional structure is shown in FIG. 10. A cross sectional view of a line A-A' and a cross sectional view of a line H-H' are indicated.

This embodiment shows one example of an active matrix liquid crystal display device of an IPS (in-plane switching) system (also called a transverse electric field system). The IPS system is characterized in that both a pixel electrode and common wirings are formed in one substrate and an electric field is applied in a transverse direction. An orientation is controlled such that a longitudinal axis of a liquid crystal molecule is aligned to a direction substantially parallel with the surface of the substrate. When this IPS system is used, a view angle can be increased.

In FIG. 9, reference numeral 1101 denotes a first semiconductor layer, 1102 and 1103 denote second semiconductor layers, 1104 denotes a first electrode, 1105 denotes a second electrode, 1106 denotes a source wiring, 1107 denotes a gate wiring, 1108 and 1109 denote common wirings, 1110 denotes a connection electrode, and 1111 denotes a pixel electrode. Note that the pixel electrode and the common wirings are located so as to generate an electric field parallel with the surface of the substrate. Also, the common wirings are located so as to overlap the source wiring. Thus, an opening ratio of the pixel portion is improved.

Also, as shown in FIG. 10, the first electrode 1104, the second electrode 1105, and the source wiring 1106 are simultaneously formed on an insulating film which covers the first semiconductor layer and the second semiconductor layers. Also, the pixel electrode 1111, the connection electrode 1110, the gate wiring 1107, and the common wiring 1109 are simultaneously foamed on an interlayer insulating film covering the source wiring.

Also, the first electrode is electrically connected with the gate wiring. The first electrode overlapped with the first semiconductor layer functions as the gate electrode.

In this embodiment, a pixel electrode having a rectangular shape is indicated. However, the pixel electrode and the common electrodes are formed into an angulation electrode structure, and a view angle may be further increased.

Also, the storage capacitor is composed of the second semiconductor layer, the insulating film covering the second semiconductor layers, and the second electrode. The second electrode is electrically connected with the gate wiring of an adjacent pixel. Further, an impurity element for providing an n-type is added to the second semiconductor layer.

Note that, in this embodiment, when a mask pattern used in Embodiment 1 is changed, the pixel structure is obtained by the same steps as those in Embodiment 1.

After the state shown in FIGS. 9 and 10 is obtained using Embodiment 1, a liquid crystal device is obtained by the method described in Embodiment 2. A gap between pixels is light-shielded by using a color filter provided in an opposite substrate as in the case of Embodiment 2. Note that, since an IPS system is used, it is necessary to change orientation processing and the like.

Embodiment 6

In this embodiment, with respect to the TFT (channel length: L/channel width: W=10 μm/8 μm) of the driver circuit obtained in Embodiment 1, a relationship between a length in a channel length direction of an impurity region (also called an Lov region) overlapped with a gate electrode and reliability is indicated.

Here, it is assumed that a time until a maximum value (μFE(max)) of mobility of a TFT is varied at 10% in the case where the length of the Lov region is a predetermined length is the life of the TFT. Then, an inverse number of a drain voltage is plotted on a semilogarithmic graph and a value of the drain voltage at a time when the life becomes 10 years is led as a 10-years assurance voltage based on a linear relationship obtained from this graph.

In this embodiment when a length in the channel length direction of the Lov region (also called an Lov length) is set to be 0.5 μm, 0.78 μm, 1 μm, 1.5 μm, and 1.7 μm, it is assumed that a time until an on current value of a TFT is varied at 10% is the life of the TFT. Then, an inverse number of a drain electrode is plotted on a semilogarithmic graph and a value of the drain voltage at a time when the life becomes 10 years is led as a 10-years assurance voltage based on a linear relationship obtained from this graph. The thus obtained result is shown in FIG. 15.

Figure 15:
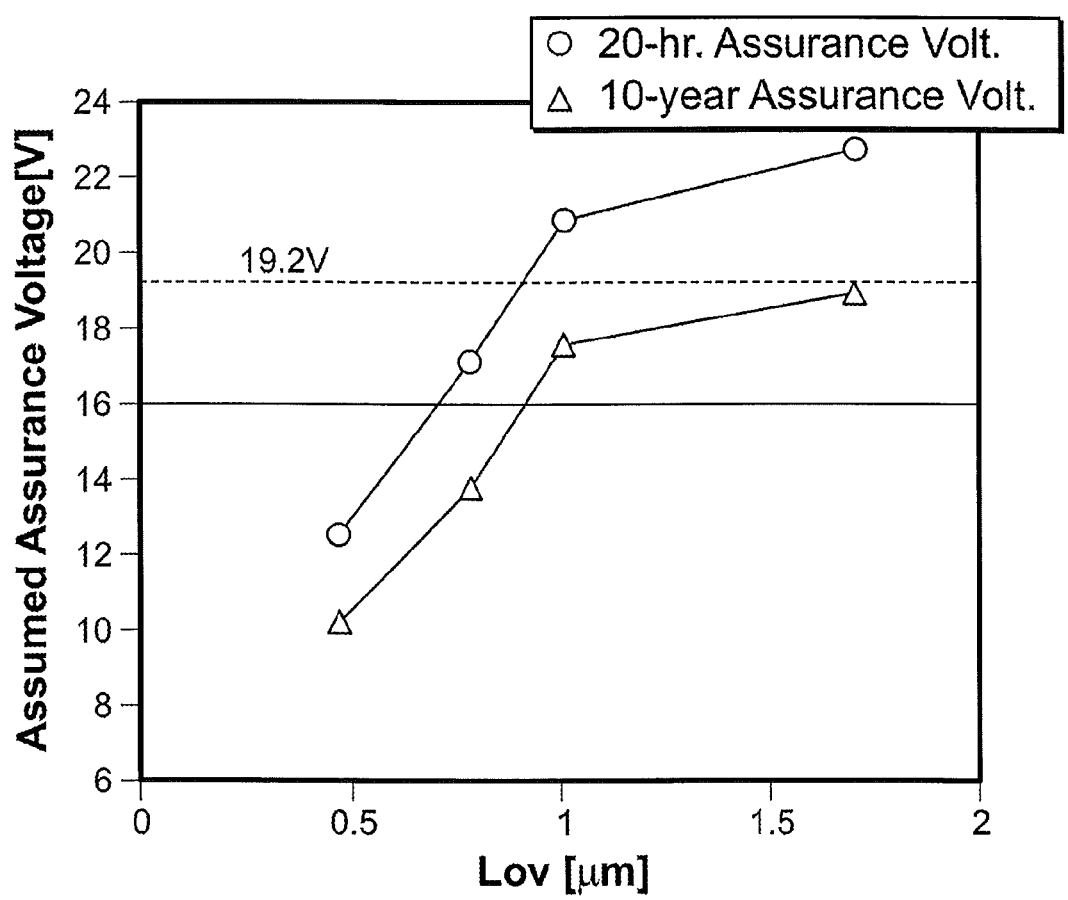
FIG. 15 shows a relationship between reliability (20-hours assurance voltage and 10-years assurance voltage) and a Lov length in a TFT of a driver circuit.

Note that, when a value of a drain electrode in the case where a time until an on current value of a TFT is varied at 10% becomes 20 hours is assumed as a 20-years assurance voltage, a result obtained by a transient stress test is also shown in FIG. 15.

As shown in FIG. 15, when it is assumed to be used in a 16 V system device and a margin of 20% is considered, a length of the Lov region of an n-channel TFT with 19.2 V (16×1.2) or higher is desirably 1 μm or longer in the case of a 20-years assurance voltage. Also, in the case of a 10-years assurance voltage, the length is desirably 1.5 μm or longer.

Embodiment 7

Figure 16A:
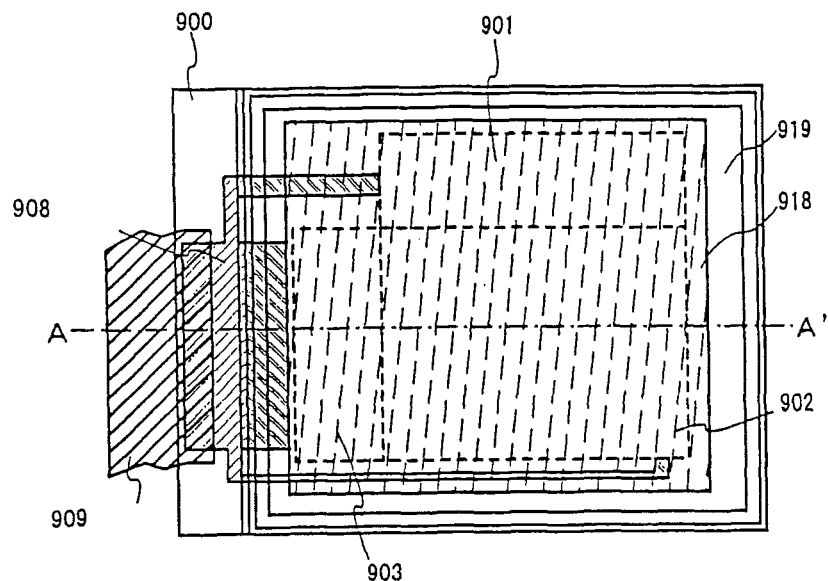
FIGS. 16A and 16B are a top view of an EL module and a cross sectional view thereof, respectively.
Figure 16B:
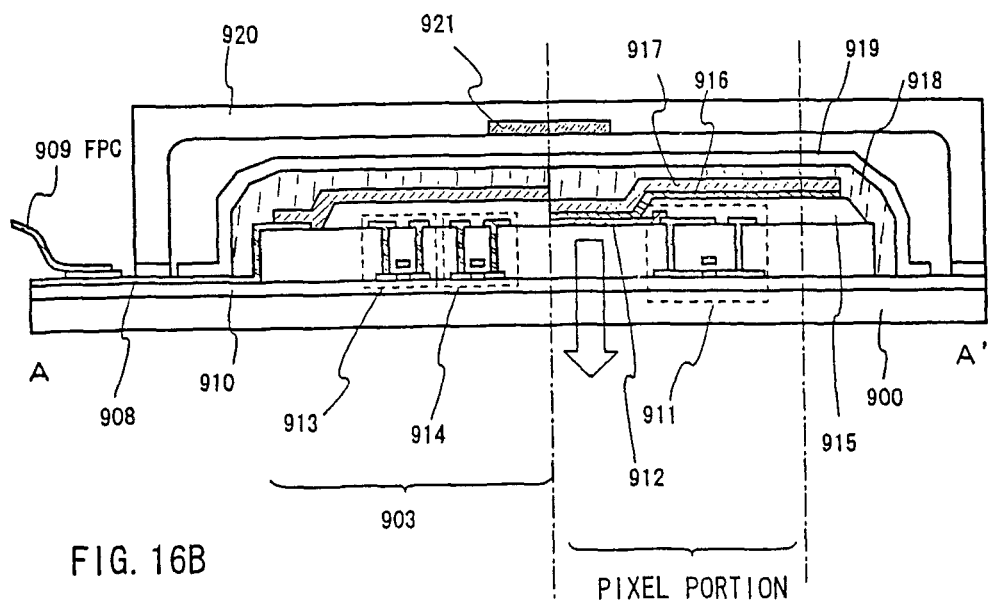

In this embodiment, an example in which a light emitting device including an organic light emitting device (OLED) is manufactured is shown in FIGS. 16A and 16B.

FIG. 16A is a top view of a module having an OLED, a so-called EL module, and FIG. 16B is a cross sectional view obtained by cutting FIG. 16A along a line A-A'. A pixel portion 902, a source side driver circuit 901, and a gate side driver circuit 903 are formed on a substrate 900 having an insulating surface (for example, a glass substrate, a crystallized glass substrate, a plastic substrate, or the like). The pixel portion and the driver circuits can be obtained in accordance with the above-mentioned Embodiment 1.

Also, reference numeral 918 denotes a seal member, 919 denotes a protective film made of aluminum oxynitride, aluminum nitride, or a DLC film. The Pixel portion and the driver circuit portion are covered with the seal member 918 and the seal member 918 is covered with the protective film 919. Further, the pixel portion and the driver circuit portion are sealed with a cover member 920 using, an adhesive. The cover member 920 may be made of any composition medium such as plastic, glass, metal, or ceramics. Also, a shape of the cover member 920 and a shape of a support are not particularly limited and these may include one having a flat surface or one having a curved surface. Also, these may be flexible. Further, these may be formed into a film shape. In order to resist the deformation due to heat, external force, and the like, a member having the same material as the substrate 900, for example, a glass substrate is desirably used as the cover member 920. In this embodiment, the cover member is processed in a concave portion shape (3 μm to 10 μm in depth) shown in FIG. 16B by a sandblast method or the like. Further, it is desirably processed to form a concave portion (50 μm to 200 μm in depth) capable of locating a drying agent 921. When an EL module is manufactured by multiple beveling, the substrate and the cover member are bonded and then may be cut using a $CO_2$ laser or the like so as to align end surfaces.

Also, although not shown here, in order to prevent the reflection of a background due to the reflection of light from a metallic layer (here, cathode and the like) to be used, a circular polarization means which is called a circular polarizing plate made from a phase differential plate (λ/4 plate) and a polarizing plate may be provided on the substrate 900.

Note that reference numeral 908 denotes a wiring for transmitting signals inputted to the source side driver circuit 901 and the gate side driver circuit 903. The wiring receives a video signal and a clock signal from a FPC (flexible printed circuit) 909 which is to be an external input terminal. Also, the light emitting device of this embodiment may be operated in digital drive or may be operated in analog drive. The video signal may be a digital signal or may be an analog signal. Note that, although only the FPC is shown here, a printed wiring board (PWB) may be attached to the FPC. The light emitting device in this specification includes not only a main body of the light emitting device but also a light emitting device to which an FPC or a PWB is attached. Also, a complicated integrated circuit (memory, a CPU, a controller, a D/A converter, and the like) can be formed together with the pixel portion and the driver circuits on the same substrate. However, it is difficult to manufacture them using a small number of masks. Thus, it is preferable that an IC chip including a memory, a CPU, a controller, a D/A controller and the like is mounted by a COG (chip on glass) method, a TAB (tape automated bonding) method, or a wire bonding method.

Next, the cross sectional structure will be described using FIG. 16B. An insulating film 910 is provided on the substrate 900. The pixel portion 902 and the gate side driver circuit 903 are formed on the insulating film 910. The pixel portion 902 is composed of a current control TFT 911 and a plurality of pixels including a pixel electrode 912 electrically connected with the drain thereof. Actually, a plurality of TFTs are formed in one pixel. However, for simplification, only the current control TFT 911 is shown here. The gate side driver circuit 903 is composed of n-channel TFTs 913 and 914.

These TFTs (including TFTs 911, 913, and 914) may be manufactured according to the n-channel TFT in the above-mentioned Embodiment 1.

Also, with respect to a display device having an OLED, there are a driving method having a circuit design in which a constant voltage is applied to the OLED to supply a current thereto, a driving method having a circuit design in which a constant current is supplied to the OLED to control a voltage applied to the OLED, a driving method having a circuit design in which a constant current is supplied to the OLED, and the like. However, regardless of a driving method, brightness of a pixel is determined by an on current ($I_{on}$) of a TFT, which is electrically connected with the OLED and supplies a current to the OLED (in this specification, this TFT is called a current control TFT and corresponds to the current control TFT 911 in FIG. 16B).

Note that, in this embodiment, n-channel TFTs are used as a switching TFT and as the current control TFT 911. However, the present invention is not limited to such a structure. The number of TFTs provided in one pixel may be 3, 4, 5, 6, or more. The switching TFT and the current control TFT may be made from p-channel TFTs. Note that, when the cathode of the OLED is used as a pixel electrode, the current control TFT is desirably an n-channel TFT. Also, when the anode of the OLED is used as a pixel electrode, the current control TFT is desirably a p-channel TFT.

Also, an insulating film having high flatness and high light transmitting property is desirably used as an insulating film provided between the active layer of the TFT and the OLED. Concretely, an organic resin film and a silicon nitride film are preferably laminated by an application method and a sputtering method, respectively. Or, it is preferable that flattening processing is performed after the formation of the insulating film. A known technique for improving flatness, for example, a polishing step which is called chemical-mechanical polishing (hereinafter referred to as CMP) may be used as the flattening processing. When the CMP is used, for example, a polishing agent in which a fumed silica particle obtained by thermally decomposing a silicon chloride gas is dispersed to a KOH added aqueous solution is preferably used as a polishing agent (slurry) of the CMP to the insulating film. The insulating film is removed by about 0.1 μm to 0.5 μm by the CMP to flat the surface. With respect to the OLED, when a film thickness of an organic compound layer is nonuniform, uneven light emission is produced. Thus, the film thickness is desirably uniform as far as possible.

A material for blocking diffusion of an impurity ion such as an alkali metallic ion or an alkali earth metallic ion and positively absorbing an impurity ion such as an alkali metallic ion or an alkali earth metallic ion is preferable as the insulating film provided between the active layer of the TFT and the OLED. Further, a material which is resistant to a process temperature in a later step is suitable. As an example of a material suitable for such a condition, there is a silicon nitride film containing a large amount of fluorine. The concentration of fluorine contained in the silicon nitride film is $1 \times 10^{19}/cm^3$ or more, preferably, a composition ratio of fluorine contained in the silicon nitride film is set to be 1% to 5%. Fluorine contained in the silicon nitride film is bonded to an alkali metallic ion, an alkali earth metallic ion, or the like, and absorbed in the film. Also, as another example, there is an organic resin film containing a particulate made of antimony (Sb) compound, tin (Sn) compound, or indium (In) compound, which absorbs an alkali metallic ion, an alkali earth metallic ion, or the like, for example, an, organic resin film containing antimony pentoxide particulate ($Sb_2O_5 \cdot nH_2O$). Note that this organic resin film contains a particulate with an average particle size of 10 nm to 20 nm and has a very high light transmitting property. An antimony compound represented by the antimony pentoxide particle is easy to absorb an impurity ion such as an alkali metallic ion or an alkali earth metallic ion.

Also, a layer indicated by $AlN_xO_y$ may be used as another material of the insulating film provided between the active layer of the TFT and the OLED. A sputtering method is performed using, for example, an aluminum nitride (AlN) target and an oxynitride layer (layer indicated by $AlN_xO_y$) containing aluminum obtained by film formation in an atmosphere in which an argon gas, a nitrogen gas, and an oxygen gas are mixed is a film containing nitrogen at 2.5 atom % to 47.5 atom %. This film is characterized by a high thermal conductivity, a heat radiation effect, and a very high light transmitting property in addition to an effect capable of blocking moisture and oxygen. In addition, it is possible to prevent an impurity such as alkali metal or alkali earth metal from entering the active layer of the TFT.

The pixel electrode 912 electrically connected with an electrode 809 electrically connected with one impurity region 806 of the current control TFT 911 functions as the anode of the OLED. A conductive film having a large work function, typically, a conductive oxide film is used as the anode. Indium oxide tin oxide, zinc oxide, or a compound thereof is preferably used as the conductive oxide film. Banks 915 made of an inorganic insulator or an organic insulator are formed in both ends of the pixel electrode 912. An EL layer 916 and a cathode 917 of the OLED are formed on the pixel electrode 912.

The EL layer 916 (layer for producing light emission and moving a carrier therefor) is preferably formed by freely combining a light emitting layer, a charge transport layer, and a charge injection layer. For example, a low molecular system organic EL material or a polymer system organic EL material is preferably used. Also, a thin film made of a light emitting material (singlet compound) for producing light emission (fluorescence) by singlet excitation or a thin film made of a light emitting material (triplet compound) for producing light emission (phosphorescence) by a triplet excitation can be used as the EL layer. Also, an inorganic material such as silicon carbide can be used as the charge transport layer or the charge injection layer. Known materials can be used as the organic EL material and the inorganic material.

The cathode 917 also functions as a wiring common to all pixels and is electrically connected with the FPC 909 through the connection wiring 908. It is preferable to use metal having a small work function (typically, a metallic element belonging to the group 1 or the group 2 of the periodic table) or an alloy containing these metal as a material of the cathode 917. Since light emission efficiency is improved as a work function decreases, an alloy material containing Li (lithium) which is one kind of alkali metal is desirably used as a material of the cathode. Further, all elements which are included in the pixel portion 902 and the gate side driver circuit 903 are covered with the cathode 917, the seal member 918, and the protective film 919.

Note that it is preferable that a material which is transparent or translucent to visible light is used for the seal member 918. Also, it is desirable that a material which does not allow transmission of moisture and oxygen is used for the seal member 918.

Also, after the OLED is completely covered with the seal member 918, as shown in FIG. 16B, it is preferable that at least the protective film 919 made from a single layer or a lamination layer selected from the group consisting of an AlON film an AlN film, an $Al_2O_3$ film, and a DLC film is provided on the surface (exposed surface) of the seal member 918. Also, the protective film may be provided on the entire surface including the rear surface of the substrate. Here, the attention is required so as not to form the protective film in a portion where an external input terminal (FPC) is provided. Processing is made so as not to form the protective film using a mask. Also, processing is made so as not to form the protective film by covering the external input terminal portion using a tape such a masking tape used in a CVD apparatus.

With the above structure, when the OLED is sealed with the seal member 918 and the protective film 919, the OLED can be completely shut from the outside and it is possible to prevent a substance such as water or oxygen for promoting deterioration due to oxidation of the EL layer from entering from the outside. In addition, when a film having thermal conductivity (AlON film, AlN film, or the like) is used as the protective film, heat produced at drive of the OLED can be diffused. Thus, a light emitting device having high reliability can be obtained.

Figure 17:
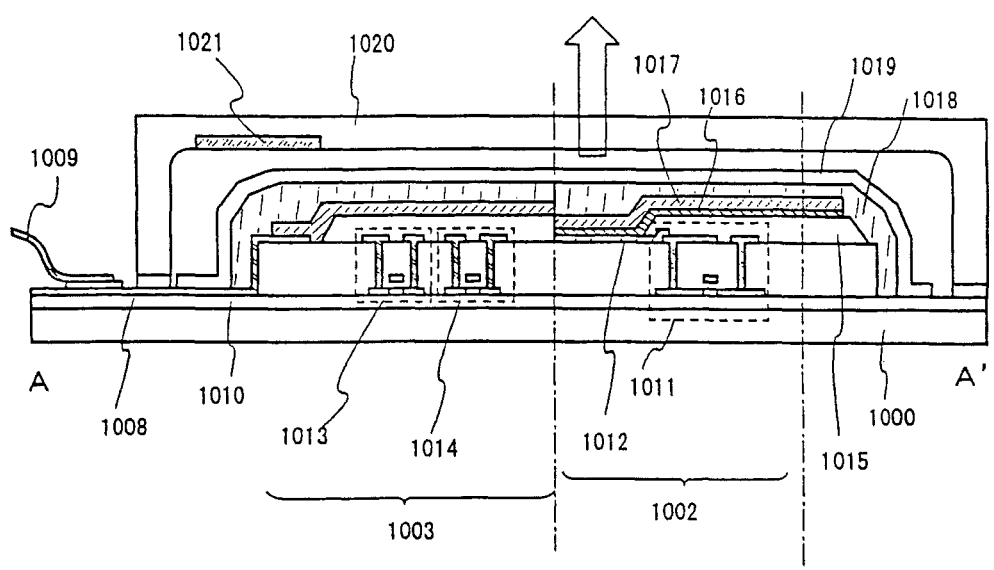
FIG. 17 is a cross sectional view of an EL module.

Further, a structure may be employed in which the pixel electrode is used as the cathode and the EL layer and the anode are laminated such that light emission is produced in a direction reverse to the case of FIG. 16B. One example is shown in FIG. 17. Note that a top view is omitted here because it is the same.

The cross sectional structure shown in FIG. 17 will be described below. In addition to a glass substrate and a quartz substrate, a semiconductor substrate or a metallic substrate can be also used as a substrate 1000. An insulating film 1010 is provided on the substrate 1000. A pixel portion 1002 and a gate side driver circuit 1003 are formed on the insulating film 1010. The pixel portion 1002 is composed of a current control TFT 1011 and a plurality of pixels including a pixel electrode 1012 electrically connected with the drain of the current control TFT 1011. Also, the gate side driver circuit 1003 is composed of a combination of n-channel TFTs 1013 and 1014.

The pixel electrode 1012 functions as the cathode of the OLED. Also, banks 1015 are formed in both ends of the pixel electrode 1012. An EL layer 1016 and an anode 1017 of the OLED are formed on the pixel electrode 1012.

The anode 1017 also functions as a wiring common to all the pixels and is electrically connected with an FPC 1009 through a connection wiring 1008. Further, all elements which are included in the pixel portion 1002 and the gate side driver circuit 1003 are covered with the anode 1017, a seal member 1018, and a protective film 1019. A cover member 1021 and the substrate 1000 are bonded through an adhesive. A concave portion is provided in the cover member, and a dry agent 1021 is located therein.

It is preferable that a material, which is transparent or translucent to visible light is used for the seal member 1018. Also, it is desirable that a material which does not allow transmission of moisture and oxygen as far as possible is used for the seal member 1018.

Also, in the case of FIG. 17, since the pixel electrode is used as the cathode and the EL layer and the anode are laminated, a direction of light emission becomes a direction indicated by an arrow in FIG. 17.

Also, although not shown here, in order to prevent the reflection of a background due to the reflection of light from a metallic layer to be used (here, the pixel electrode which is to be the cathode and the like), a circular polarization means called a circular polarizing plate made from a phase differential plate ($\lambda$/4 plate) and a polarizing plate may be provided on the cover member 1020.

This embodiment can be freely combined with any of Embodiments 1, 4, and 6.

A driver circuit can be composed of the shift register described in Embodiment 4. However, a case where a decoder composed of only n-channel TFTs is used instead of the shift register and the whole source side driver circuit and the whole gate side driver circuit are composed of an E-type TFTs will be described below using FIGS. 18 to 20.

Figure 18:
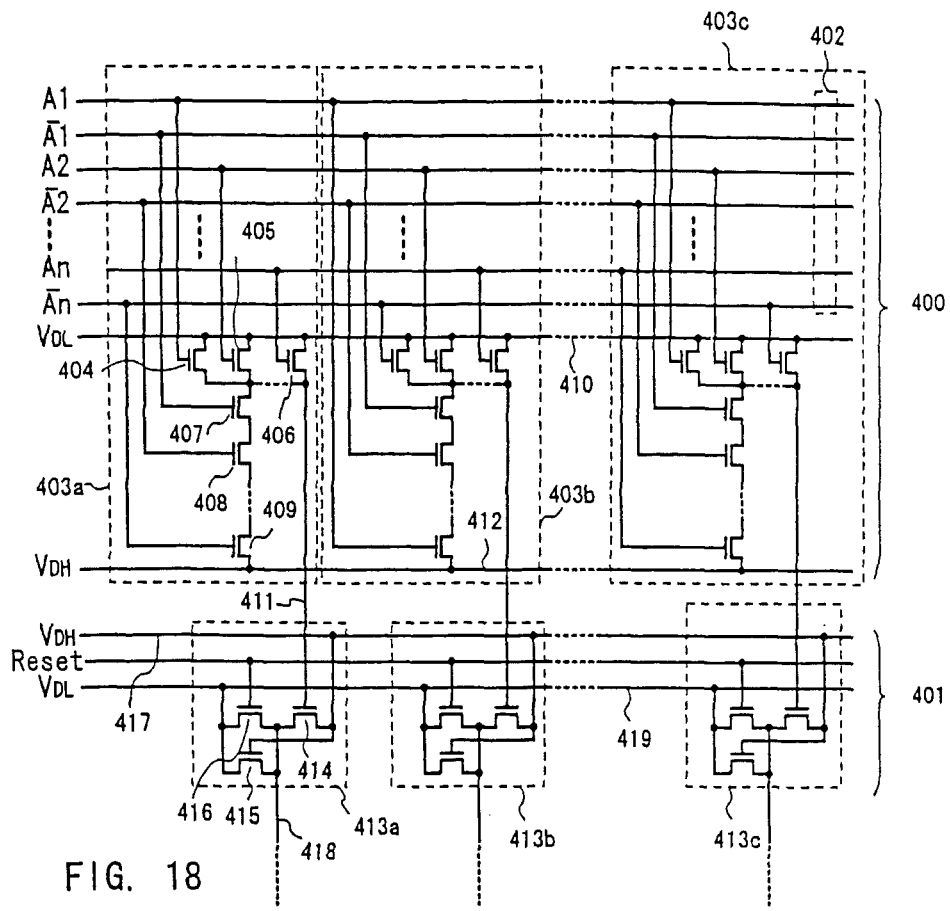
FIG. 18 shows a structure of a gate side driver circuit.

FIG. 18 shows an example of a gate side driver circuit. In FIG. 18, reference numeral 400 denotes a decoder of the gate side driver circuit and 401 denotes a buffer portion of the gate side driver circuit. Note that the term buffer portion indicates a portion in which a plurality of buffers (buffer amplifiers) are integrated. Also, the term buffer indicates a circuit for performing driving without providing influence of a poststage to a prestage.

First, the gate side decoder 400 will be described. Reference numeral 402 denotes input signal lines (hereinafter referred to as selection lines) of the decoder 400. A1, A1 bar (signal obtained by inverting a polarity of A1), A2, A2 bar (signal obtained by inverting a polarity of A2), . . . , An, and An bar (signal obtained, by inverting a polarity of An) are indicated here. That is, it may be considered that "2n" selection lines are arranged.

Figure 19:
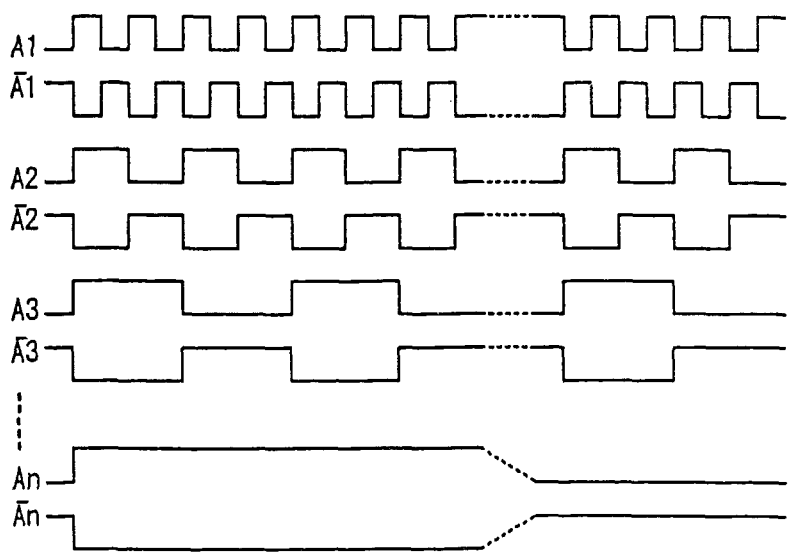
FIG. 19 is a timing chart of decoder input signals.

The number of selection lines is determined by the number of columns of gate wirings outputted from the gate side driver circuit. For example, when a pixel portion for VGA display is provided, the number of the gate wirings becomes 480. Thus, it is necessary to use 18 selection lines in total in case of 9 bits (corresponding to n=9). The selection lines 402 transmit signals indicated in a timing chart shown in FIG. 19. As shown in FIG. 19, when a frequency of A1 is given by 1, a frequency of A2 becomes $2^{-1}$ times, a frequency of A3 becomes $2^{-2}$ times, and a frequency of An becomes $2^{-(n-1)}$ times.

Also, reference numeral 403a denotes a first stage NAND circuit (also called a NAND cell), 403b denotes a second stage NAND circuit, and 403c denotes an n-th stage NAND circuit. The number of NAND circuits is required so as to correspond to the number of gate wirings, and "n" NAND circuits are required here. That is, according to the present invention, the decoder 400 is composed of a plurality of NAND circuits.

Also, the NAND circuits 403a to 403c are composed of combination of n-channel TFTs 404 to 409. Note that, actually, 2n TFTs are used for the NAND circuit 403. Respective gates of the n-channel TFTs 404 to 409 are connected with any one of the selection lines 402 (A1, A1 bar, A2, A2 bar, . . . , An, and An bar).

At this time, in the NAND circuit 403a, the n-channel TFTs 404 to 406 having the gates, which are connected with any one of A1, A2, . . . , and An (these are called positive selection lines) are connected with one another in parallel, connected with a negative power source line ($V_{DL}$) 410 as a common source, and connected with an output line 71 as a common drain. Also, the n-channel TFTs 407 to 409 having the gates, which are connected with any one of A1 bar, A2 bar, and An bar (these are called negative selection lines) are connected with one other in serial. The source of the n-channel TFT 409 located in a circuit end is connected with a positive power source line ($V_{DH}$) 412. The drain of the n-channel TFT 407 located in the other circuit ends is connected with an output line 411.

As described above, according to the present invention, the NAND circuit includes "n" n-channel TFTs connected in serial and "n" n-channel TFTs connected in parallel. Note that, with respect to the "n" NAND circuits 403a to 403c, combinations of the n-channel TFTs and the selection lines are different from one another. That is, it is constructed so as to select only the one output line 411 and signals for selecting the output lines 411 in order from an end are inputted to the selection lines 402.

Next, the buffer portion 401 is composed of a plurality of buffers 413a to 413c respectively corresponding to the NAND circuit 403a to 403c. Note that the buffers 413a to 413c may use the same structure.

Also, the buffer 413a to 413c are composed of n-channel TFTs 414 to 416. The output line 411 from the decoder is inputted as the gate of the n-channel TFT 414 (first n-channel TFT). With respect to the n-channel TFT 414, a positive power source line ($V_{DH}$) 417 is given as the source and a gate wiring 418 which leads to the pixel portion is given as the drain. With respect to the n-channel TFT 415 (second n-channel TFT), the positive power source line ($V_{DH}$) 417 is given as the gate, a negative power source line ($V_{DL}$) 419 is given as the source, and the gate wiring 418 is given as the drain. The TFT 415 is always in an on-state.

That is, in the present invention, the buffers 413a to 413c include the first n-channel TFT (n-channel TFT 414) and the second n-channel TFT (n-channel TFT 415) which is connected in serial with the first n-channel TFT and in which the drain of the first n-channel TFT is used as the gate.

Also, with respect to the n-channel TFT 416 (third n-channel TFT), a reset signal line (Reset) is given as the gate, the negative power source line ($V_{DL}$) 419 is given as the source, the gate wiring 418 is given as the drain. Note that the negative power source line ($V_{DL}$) 419 may be given as a ground power source line (GND).

At this time, a relationship between a channel width (given by W1) of the n-channel TFT 415 and a channel width (given by W2) of the n-channel TFT 414 is W1<W2. Note that the channel width is a length of the channel forming region in a direction perpendicular to the channel length.

The operation of the buffer 413a is as follows. First, when a negative voltage is applied to the output line 411, the n-channel TFT 414 becomes an off-state (state in which a channel is not produced). On the other hand, since the n-channel TFT 415 is always in an on-state (state in which a channel is produced), a voltage of the negative power source line 419 is applied to the gate wiring 418.

However, when a positive voltage is applied to the output line 411, the n-channel TFT 414 becomes an on-state. At this time, since the channel width of the n-channel TFT 414 is larger than that of the n-channel TFT 415, a potential of the gate wiring 418 is influenced by the output of the n-channel TFT 414. As a result, a voltage of the positive power source line 417 is applied to the gate wiring 418.

Thus, when a positive voltage is applied to the output line 411, the gate wiring 418 outputs the positive voltage (voltage in which the n-channel TFT used as a switching element of a pixel becomes an on-state). On the other hand, when a negative voltage is applied to the output line 411, the gate wiring 418 always outputs the negative voltage (voltage in which the n-channel TFT used as a switching element of a pixel becomes an off-state).

Note that the n-channel TFT 416 is used as a reset switch for forcingly reducing a voltage of the gate wiring 418 to which the positive voltage is applied to a negative voltage. That is, after a selection period of the gate wiring 418 is elapsed, a reset signal is inputted to apply a negative voltage to the gate wiring 418. Note that the n-channel TFT 416 can be omitted.

Figure 20:
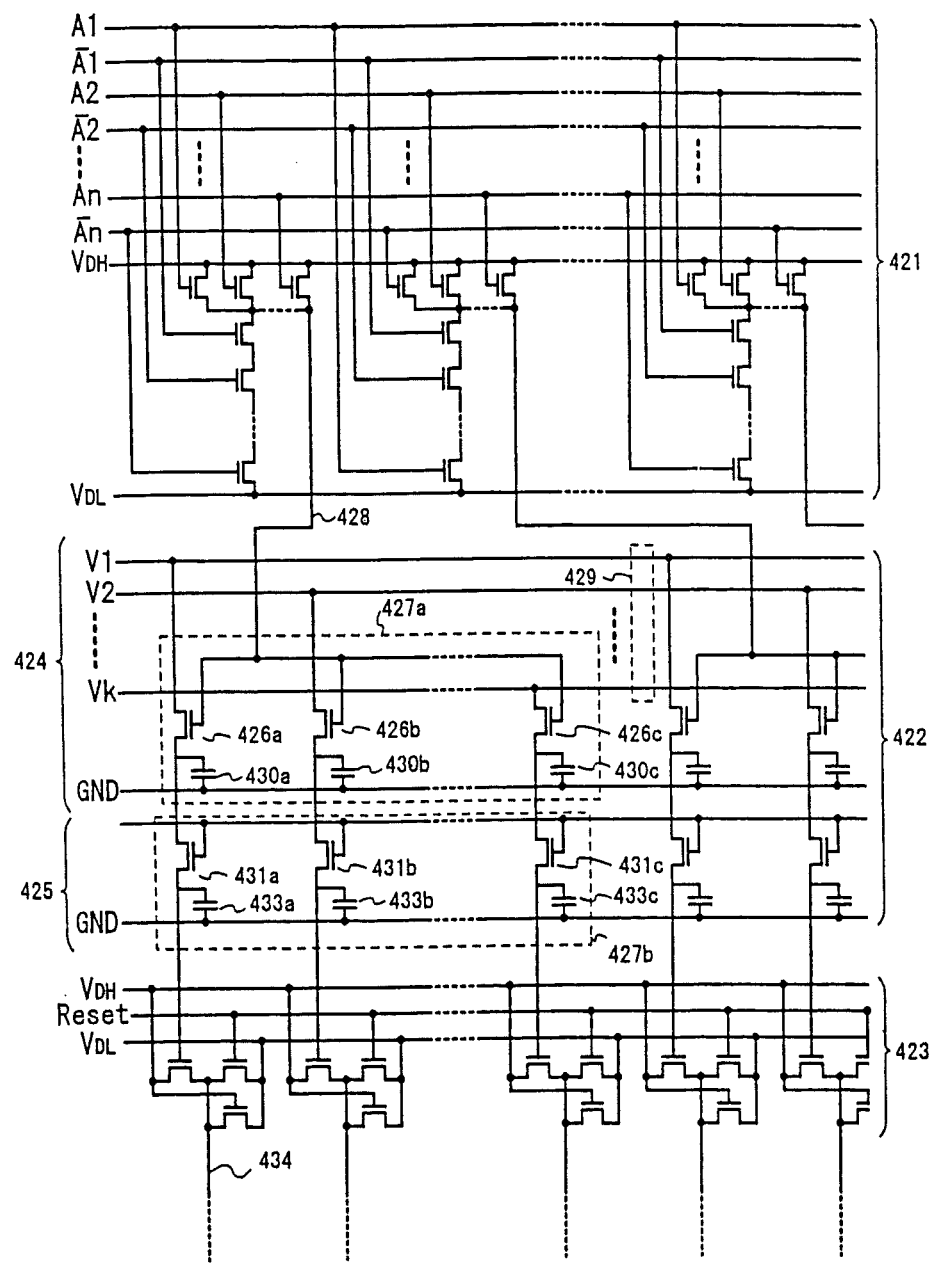
FIG. 20 shows a structure of a source side driver circuit.

The gate wirings are selected in order by the gate side driver circuit which is operated as described above. Next, a structure of the source side driver circuit is shown in FIG. 20. The source side driver circuit shown in FIG. 20 includes a decoder 421, a latch 422, and a buffer portion 423. Note that the decoder 421 and the buffer portion 423 have the same structures as the gate side driver circuit and the description thereof is omitted here.

In case of the source side driver circuit shown in FIG. 20, the latch 422 is composed of a first stage latch 424 and a second stage latch 425. Also, the first stage latch 424 and the second stage latch 425 each have a plurality of units 427 composed of "m" n-channel TFTs 426a to 426c. An output line 428 from the decoder 421 is inputted to the gates of the "m" n-channel TFTs 426a to 426c composing the unit 427. Note that "m" is an arbitrary integer.

For example, in case of VGA display, the number of source wirings is 640. When "m"=1, 640 NAND circuits and 20 selection lines (corresponding to 10 bits) are required. However, when "m"=8, the number of NAND circuits to be required becomes 80 and the number of required selection lines becomes 14 (corresponding to 7 bits). That is, when the number of source wirings is given by "M", the number of NAND circuits to be required becomes (M/m).

Then, the sources of the n-channel TFTs 426a to 426c are connected with respective video signal lines (V1, V2, . . . , Vk) 429. That is, when a positive voltage is applied to the output line 428, the n-channel TFTs 426a to 426c simultaneously become an on-state to capture corresponding video signals therein. Further, the thus captured video signals are held in capacitors 430a to 430c respectively connected with the n-channel TFTs 426a to 426c.

Also, the second stage latch 425 has a plurality of units 427b. The unit 427b is composed of "m" n-channel TFTs 431a to 431c. All the gates of the n-channel TFTs 431a to 431c are connected with a latch signal line 432. When a negative voltage is applied to the latch signal line 432, the n-channel TFTs 431a to 431c simultaneously become an on-state.

As a result, the signals held in the capacitors 430a to 430c are held in capacitors 433a to 433c respectively connected with the n-channel TFTs 431a to 431c and outputted to the buffer portion 423 being simultaneous with this holding. Then, as described in FIG. 20, the signals are outputted to source wirings 434 through the buffer portion. The source wirings are selected in order by the source side driver circuit which is operated as described above.

Thus, when the gate side driver circuit and the source side driver circuit are composed of only n-channel TFTs, the whole pixel portion and the whole driver circuit can be composed of n-channel TFTs. Note that, even when either the source side driver circuit or the gate side driver circuit is used as an external IC chip, the present invention can be implemented.

Embodiment 8

When the driver circuit and the pixel portion which are formed by implementing the present invention are used, various modules (an active matrix liquid crystal module, an active matrix EL module, and an active matrix EC module) can be completed. That is, all electronic devices in which these modules are incorporated are completed by implementing the present invention.

As such electronic devices, there are a video camera, a digital camera, a head mount display (goggle-type display), a car navigation system, a projector, a car stereo, a personal computer, a portable information terminal (a mobile computer, a mobile telephone, an electronic book, or the like), and the like. FIGS. 11A to 11C and FIGS. 12A and 12B show examples of the electronic devices.

Figure 11A:
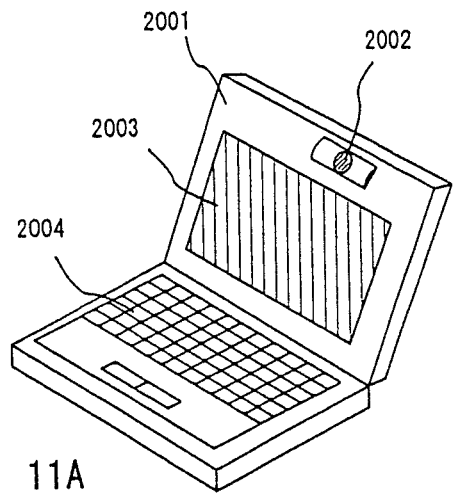
FIGS. 11A to 11C show examples of electronic devices.

FIG. 11A shows a personal computer including a main body 2001, an image input portion 2002, a display portion 2003, and a keyboard 2004.

Figure 11B:
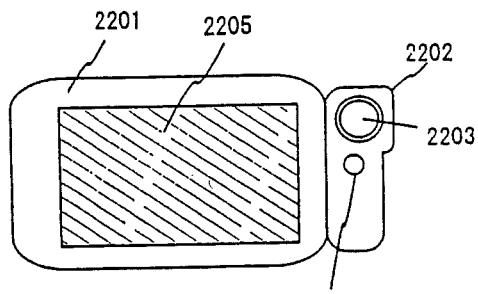

FIG. 11B shows a mobile computer (mobile computer) including a main body 2201, a camera portion 2202, an image receiving portion 2203, an operational switch 2204, and a display portion 2205.

Figure 11C:
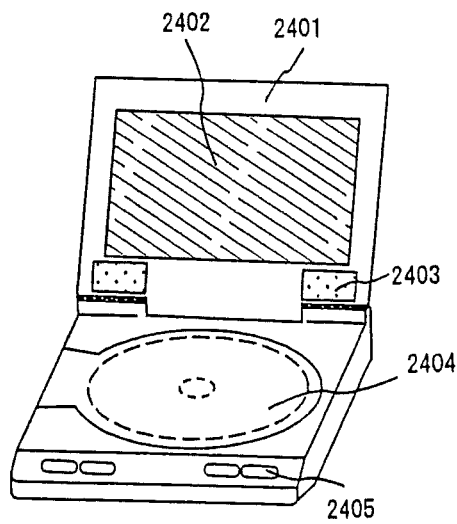

FIG. 11C shows a player using a recording medium in which a program is recorded (hereinafter referred to as a recording medium). This player includes a main body 2401, a display portion 2402, a speaker portion 2403, a recording medium 2404, an operational switch 2405 and the like. Note that with respect to this player, a DVD (digital versatile disc), a CD, or the like is used as the recording medium, and musical appreciation, movie appreciation, a game, and the Internet can be realized.

Figure 12A:
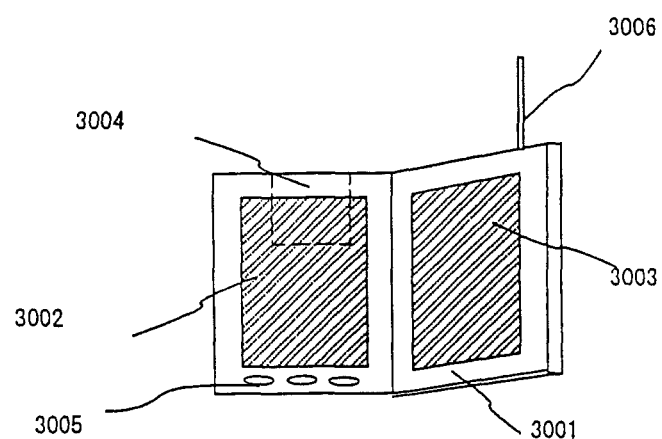
FIGS. 12A and 12B show examples of electronic devices.

FIG. 12A shows a portable book (electronic book) including a main body 3001, display portions 3002 and 3003, a recording medium 3004, an operational switch 3005, an antenna 3006 and the like.

Figure 12B:
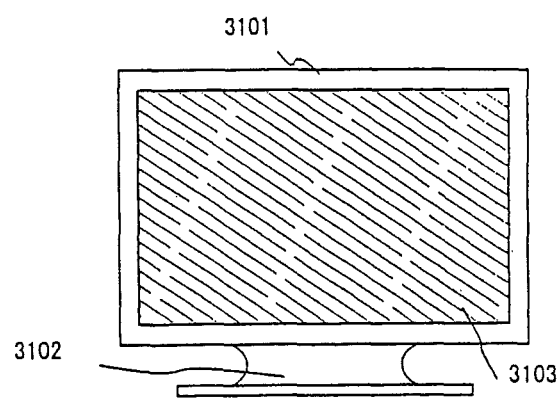

FIG. 12B shows a display including a main body 3101, a support 3102, a display portion 3103 and the like. According to the present invention, a display having 10 inches to 50 inches in a diagonal line can be completed.

As described above, an application range of the present invention is extremely wide, and the present invention can be applied to a method of manufacturing an electronic device in all fields. Also, the electronic devices in this embodiment can be realized even in a case where a structure made from any combination of Embodiments 1 to 7 is used.

According to the present invention, even when an area of the pixel portion is increased and a large size screen is thereby obtained in a semiconductor device represented by an active matrix liquid crystal display device or an active matrix light emitting device having an OLED, preferred display can be realized. Since a resistance of the source wiring of the pixel portion is greatly reduced, the present invention can be also applied to a large size screen having, for example 40 inches or 50 inches in a diagonal line.

What is claimed is:

1. A semiconductor device comprising:
a semiconductor layer over an insulating surface;
an insulating film over the semiconductor layer;

a gate electrode over the insulating film; and
a source wiring over the insulating film,
wherein each of the gate electrode and the source wiring includes a laminate structure of a first conductive film on the insulating film, a second conductive film on the first conductive film, and a third conductive film on the second conductive film,
wherein the first conductive film comprises at least one selected from the group consisting of Ta, W, Ti, Al, Cu and Mo, and
wherein the gate electrode and the source wiring have a taper structure.

2. The semiconductor device according to claim 1, wherein the second conductive film comprises at least one selected from the group consisting of Ta, W, Ti, Al, Cu and Mo.

3. The semiconductor device according to claim 1, wherein the second conductive film comprises an alloy of Al and Ti.

4. The semiconductor device according to claim 1, wherein the second conductive film comprises an alloy of Al and Si.

5. The semiconductor device according to claim 1, wherein the third conductive film comprises at least one selected from the group consisting of Ta, W, Ti, Al, Cu and Mo.

6. The semiconductor device according to claim 1, wherein the third conductive film comprises a nitride of alloy containing Ti.

7. The semiconductor device according to claim 1, wherein the source wiring is formed by etching a part of the first conductive film, a part of the second conductive film, and a part of the third conductive film in an inductively coupled plasma.

8. The semiconductor device according to claim 1, wherein the semiconductor device is a liquid crystal module of one of a transmission type and a reflection type.

9. The semiconductor device according to claim 1, wherein the semiconductor device is a light emitting device having an OLED.

10. The semiconductor device according to claim 1, wherein the semiconductor device is one selected from the group consisting of a video camera, a digital camera, a car navigation system, a personal computer, a portable information terminal, and an electronic game device.

11. A semiconductor device comprising: a semiconductor layer over an insulating surface; an insulating film over the semiconductor layer; a gate electrode over the insulating film; and a wiring over the insulating film, wherein each of the gate electrode and the wiring includes a laminate structure of a first conductive film on the insulating film, a second conductive film on the first conductive film, and a third conductive film on the second conductive film, wherein the first conductive film comprises at least one selected from the group consisting of Ta, W, Ti, Al, Cu and Mo, and wherein the gate electrode and the wiring have a taper structure.

12. The semiconductor device according to claim 11, wherein the second conductive film comprises at least one selected from the group consisting of Ta, W, Ti, Al, Cu and Mo.

13. The semiconductor device according to claim 11, wherein the second conductive film comprises an alloy of Al and Ti.

14. The semiconductor device according to claim 11, wherein the second conductive film comprises an alloy of Al and Si.

15. The semiconductor device according to claim 11, wherein the third conductive film comprises at least one selected from the group consisting of Ta, W, Ti, Al, Cu and Mo.

16. The semiconductor device according to claim 11, wherein the third conductive film comprises a nitride of alloy containing Ti.

17. The semiconductor device according to claim 11, wherein the wiring is formed by etching a part of the first conductive film, a part of the second conductive film, and a part of the third conductive film in an inductively coupled plasma.

18. The semiconductor device according to claim 11, wherein the semiconductor device is a liquid crystal module of one of a transmission type and a reflection type.

19. The semiconductor device according to claim 11, wherein the semiconductor device is a light emitting device having an OLED.

20. The semiconductor device according to claim 11, wherein the semiconductor device is one selected from the group consisting of a video camera, a digital camera, a car navigation system, a personal computer, a portable information terminal, and an electronic game device.

* * * * *

UNITED STATES PATENT AND TRADEMARK OFFICE
CERTIFICATE OF CORRECTION

| | |
|---|---|
| PATENT NO. | : 8,735,889 B2 |
| APPLICATION NO. | : 13/286280 |
| DATED | : May 27, 2014 |
| INVENTOR(S) | : Shunpei Yamazaki et al. |

It is certified that error appears in the above-identified patent and that said Letters Patent is hereby corrected as shown below:

In the Specification

Column 1, line 31 – after "characteristic" insert --,--;

Column 1, line 56 – after "range" delete ",";

Column 2, line 67 – after "comprising" delete ",";

Column 3, line 9 – replace "faun" with --form--;

Column 6, line 38 – after "using" delete ".";

Column 6, line 55 – after "having" delete ",";

Column 8, line 16 – after "made" delete ",";

Column 9, line 53 – after "having" delete ",";

Column 16, line 19 – replace "foamed" with --formed--;

Column 16, line 61 – after "embodiment" insert --,--;

Column 17, line 32 – replace "Pixel" with --pixel--;

Column 17, line 36 – after "using" delete ",";

Column 19, line 22 – after "an" delete ",";

Column 19, line 49 – after "oxide" insert --,--;

Column 20, line 23 – after "film" insert --,--;

Column 21, line 7 – after "material" delete ",";

Column 21, line 33 – after "circuit" insert --,--;

Column 21, line 44 – after "obtained" delete ",";

Column 22, line 11 – after "bar," insert --...,--; and

Column 24, line 62 – after "example" insert --,--.

Signed and Sealed this
Fifth Day of May, 2015

Michelle K. Lee
*Director of the United States Patent and Trademark Office*